(12) United States Patent
Kim et al.

(10) Patent No.: US 11,723,221 B2
(45) Date of Patent: Aug. 8, 2023

(54) THREE-DIMENSIONAL SEMICONDUCTOR MEMORY DEVICES

(71) Applicant: SAMSUNG ELECTRONICS CO., LTD., Suwon-si (KR)

(72) Inventors: Sang-Kuk Kim, Seongnam-si (KR); Yunseung Kang, Seoul (KR); Oik Kwon, Yongin-si (KR); Yeonji Kim, Suwon-si (KR); Sujin Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 17/113,609

(22) Filed: Dec. 7, 2020

(65) Prior Publication Data

US 2021/0313398 A1    Oct. 7, 2021

(30) Foreign Application Priority Data

Apr. 6, 2020    (KR) .................. 10-2020-0041777

(51) Int. Cl.
*H10B 63/00* (2023.01)
*H10N 70/00* (2023.01)

(52) U.S. Cl.
CPC .......... *H10B 63/84* (2023.02); *H10N 70/063* (2023.02)

(58) Field of Classification Search
CPC ..................................................... H01L 27/24
See application file for complete search history.

(56) References Cited

U.S. PATENT DOCUMENTS

| | | | |
|---|---|---|---|
| 8,416,603 B2 | 4/2013 | Aoyama et al. | |
| 8,625,339 B2 | 1/2014 | Ong | |
| 8,835,897 B2 | 9/2014 | Okajima | |
| 9,941,333 B2 | 4/2018 | Jeong et al. | |
| 10,510,957 B2 | 12/2019 | Pirovano et al. | |
| 11,581,367 B2* | 2/2023 | Ahn ..................... | H10N 70/882 |
| 2007/0132049 A1 | 6/2007 | Stipe | |
| 2021/0313398 A1* | 10/2021 | Kim ..................... | H10N 70/063 |
| 2021/0384427 A1* | 12/2021 | Park ..................... | H10B 63/84 |

FOREIGN PATENT DOCUMENTS

JP    2011-029462    2/2011

* cited by examiner

*Primary Examiner* — Mounir S Amer
(74) *Attorney, Agent, or Firm* — F. Chau & Associates, LLC

(57) ABSTRACT

A three-dimensional (3D) semiconductor memory device including first cell stacks arranged in first and second directions; second cell stacks disposed on the first cell stacks and arranged in the first and second directions; first conductive lines extending in the first direction and provided between a substrate and the first cell stacks; common conductive lines extending in the second direction and provided between the first and second cell stacks; etch stop patterns extending in the second direction and provided between the common conductive lines and top surfaces of the first cell stacks; second conductive lines extending in the first direction and provided on the second cell stacks; and a capping pattern covering a sidewall of the common conductive lines and a sidewall of the etch stop patterns, wherein each of the common conductive lines has a second thickness greater than a first thickness of each of the first conductive lines.

20 Claims, 26 Drawing Sheets

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2020-0041777, filed on Apr. 6, 2020, in the Korean Intellectual Property Office, the disclosure of which is incorporated by reference herein in its entirety.

TECHNICAL FIELD

Exemplary embodiments of the inventive concept relate to three-dimensional (3D) semiconductor memory devices and, more particularly, to 3D semiconductor memory devices including variable resistance memory cells.

DISCUSSION OF RELATED ART

Next-generation memory devices having non-volatile characteristics without a refresh operation have been studied to provide high-capacity and low-power memory devices. In a dynamic random access memory (DRAM) chip, a memory refresh may involve restoring a charge on a capacitor to its original level. The next-generation memory device may be required to have high integration like a DRAM device, non-volatile characteristics like a flash memory device, and high speed like a static random access memory (SRAM) device.

Recently, next-generation semiconductor memory devices (e.g., ferroelectric random access memory (FRAM) devices, magnetic random access memory (MRAM) devices, and phase-change random access memory (PRAM) devices) have been developed to provide high-performance and low-power semiconductor memory devices. Materials of these next-generation semiconductor memory devices may have resistance values that change according to currents or voltages applied thereto and may retain their resistance values even when currents or voltages are interrupted. For example, the FRAM may employ a ferroelectric layer instead of a dielectric layer to achieve non-volatility and PRAM memory cells may switch between a low resistance crystalline state and a high resistance amorphous state.

In addition, as increases in integration density of semiconductor devices have been required, 3D semiconductor memory devices including three-dimensionally arranged memory cells have been developed.

SUMMARY

According to an exemplary embodiment of the inventive concept, there is provided a three-dimensional (3D) semiconductor memory device including: first cell stacks arranged in a first direction and a second direction which are parallel to a top surface of a substrate and intersect each other; second cell stacks disposed on the first cell stacks and arranged in the first direction and the second direction; first conductive lines extending in the first direction and provided between the substrate and the first cell stacks; common conductive lines extending in the second direction and provided between the first cell stacks and the second cell stacks; etch stop patterns extending in the second direction and provided between the common conductive lines and top surfaces of the first cell stacks, the etch stop patterns including a conductive material, second conductive lines extending in the first direction and provided on the second cell stacks; and a capping pattern covering a sidewall of the common conductive lines and a sidewall of the etch stop patterns, wherein each of the common conductive lines has a second thickness greater than a first thickness of each of the first conductive lines.

According to an exemplary embodiment of the inventive concept, there is provided a 3D semiconductor memory device including: a first conductive line extending in a first direction parallel to a top surface of a substrate; first cell stacks on the first conductive line; a first filling insulation pattern between the first cell stacks; a common conductive line extending in a second direction intersecting the first direction on each of the first cell stacks; an etch stop pattern disposed between the common conductive line and each of the first cell stacks and formed of a conductive material; second cell stacks on the common conductive line; a second filling insulation pattern covering a sidewall of the common conductive line and a sidewall of the etch stop pattern; a capping pattern disposed between the sidewall of the common conductive line and the second filling insulation pattern and between the sidewall of the etch stop pattern and the second filling insulation pattern; and a second conductive line extending in the first direction on each of the second cell stacks, wherein the common conductive line has a second thickness greater than a first thickness of the first conductive line.

According to an exemplary embodiment of the inventive concept, there is provided a 3D semiconductor memory device including: a plurality of first conductive lines extending in a first direction on a substrate; a stack structure including a plurality of cell array layers vertically stacked on the first conductive lines, wherein each of the cell array layers comprises cell stacks arranged in the first direction and a second direction intersecting the first direction; a plurality of common conductive lines provided between the cell array layers, wherein a thickness of the common conductive lines is greater than a thickness of the first conductive lines; an etch stop pattern disposed between a bottom surface of each of the common conductive lines and top surfaces of the cell stacks and formed of a conductive material; and a plurality of second conductive lines extending in the first direction or the second direction on the stack structure.

According to an exemplary embodiment of the inventive concept, there is provided a 3D semiconductor memory device including: a first cell array layer comprising: a plurality of first cell stacks arranged in a first direction and a second direction which are parallel to a top surface of a substrate and intersect each other; and a first filling insulation pattern between the first cell stacks; a second cell array layer disposed on the first cell array layer and comprising: a plurality of second cell stacks arranged in the first direction and the second direction; and a second filling insulation pattern between the second cell stacks; first conductive lines extending in the first direction between the substrate and the first cell array layer and connected to the first cell stacks; common conductive lines extending in the second direction between the first cell array layer and the second cell array layer and connected to the first cell stacks and the second cell stacks; and second conductive lines extending in the first direction on the second cell array layer and connected to the second cell stacks, wherein the first and second conductive lines include a first metal material, and the common conductive lines include a second metal material having a resistivity less than that of the first metal material.

According to an exemplary embodiment of the inventive concept, there is provided a 3D semiconductor memory device including: a first cell stack disposed on a substrate; a second cell stack disposed on the first cell stack; a first conductive line disposed between the substrate and the first cell stack; a second conductive line disposed between the first cell stack and the second cell stack; an etch stop pattern disposed between the second conductive line and the first cell stack; a third conductive line disposed on the second cell stack; and a capping pattern contacting the second conductive line and the etch stop pattern.

DETAILED DESCRIPTION OF THE EMBODIMENTS

Exemplary embodiments of the inventive concept will be described more fully hereinafter with reference to the accompanying drawings.

Figure 1:
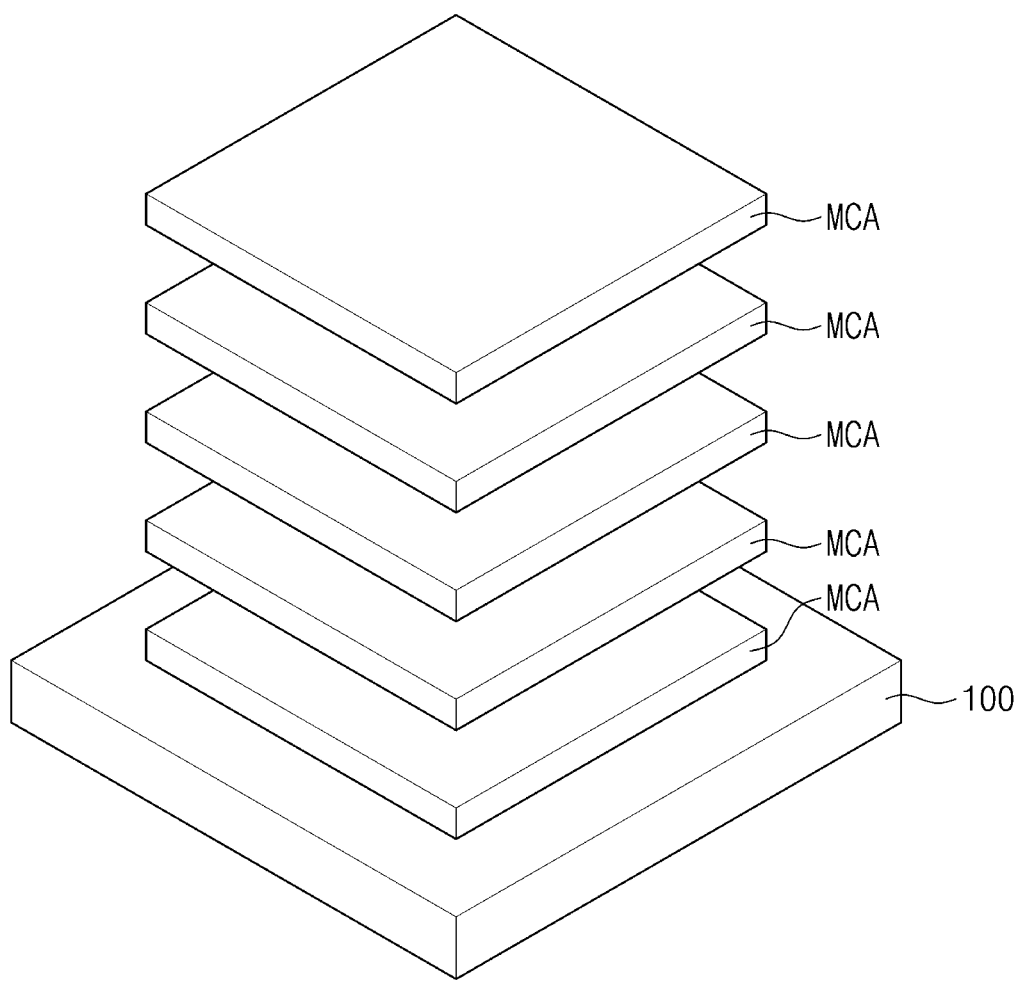
FIG. 1 is a view illustrating a three-dimensional (3D) semiconductor memory device according to exemplary embodiments of the inventive concept.

FIG. 1 is a view illustrating a three-dimensional (3D) semiconductor memory device according to exemplary embodiments of the inventive concept.

Referring to FIG. 1, a 3D semiconductor memory device according to exemplary embodiments of the inventive concept may include a plurality of memory cell array layers MCA sequentially stacked on a substrate 100. Each of the memory cell array layers MCA may include a plurality of variable resistance memory cells two-dimensionally arranged. The 3D semiconductor memory device according to exemplary embodiments of the inventive concept may include conductive lines which are disposed between the memory cell array layers MCA and are used to write, read and erase the memory cells. FIG. 1 illustrates five memory cell array layers MCA. However, exemplary embodiments of the inventive concept are not limited thereto. For example, exemplary embodiments of the inventive concept may include more than five memory cell array layers MCA or fewer than five memory cell array layers MCA.

Figure 2:
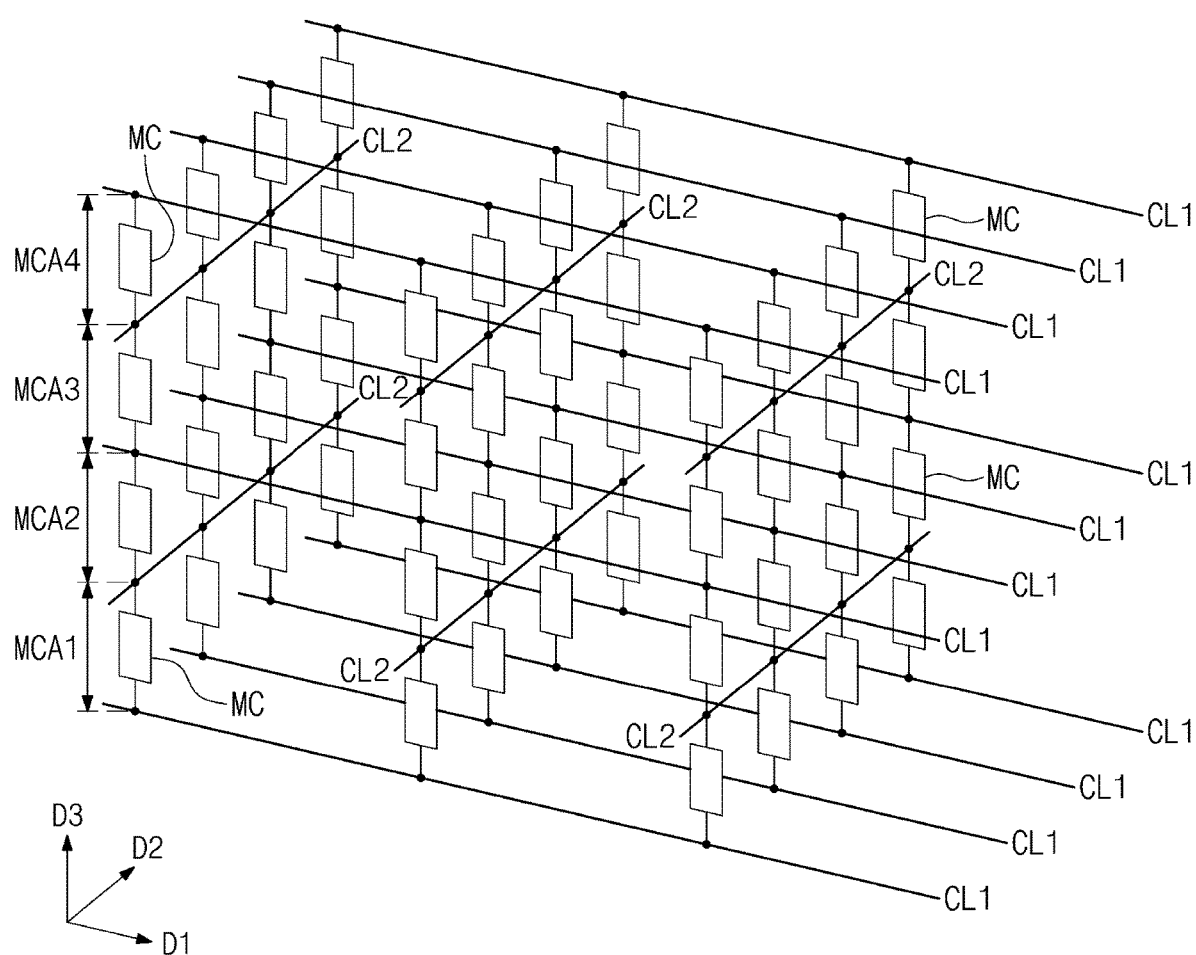
FIG. 2 is a circuit diagram illustrating a memory cell array of a 3D semiconductor memory device according to exemplary embodiments of the inventive concept.

FIG. 2 is a circuit diagram illustrating a memory cell array of a 3D semiconductor memory device according to exemplary embodiments of the inventive concept.

Referring to FIG. 2, first, second, third and fourth memory cell array layers MCA1, MCA2, MCA3 and MCA4 may be stacked in a third direction D3 on a plane extending in first and second directions D1 and D2 intersecting each other. Each of the first to fourth memory cell array layers MCA1 to MCA4 may include conductive lines CL1 and CL2 intersecting each other and a plurality of memory cells MC respectively disposed at intersection points of the conductive lines CL1 and CL2. The memory cells MC may be two-dimensionally arranged in the first direction D1 and the second direction D2 in each of the first to fourth memory cell array layers MCA1 to MCA4. The memory cells MC adjacent to each other in the third direction D3 may share the conductive lines CL1 or CL2 disposed therebetween. Four memory cell array layers MCA1 to MCA4 are illustrated as an example in FIG. 2. However, exemplary embodiments of the inventive concept are not limited thereto.

Figure 3:
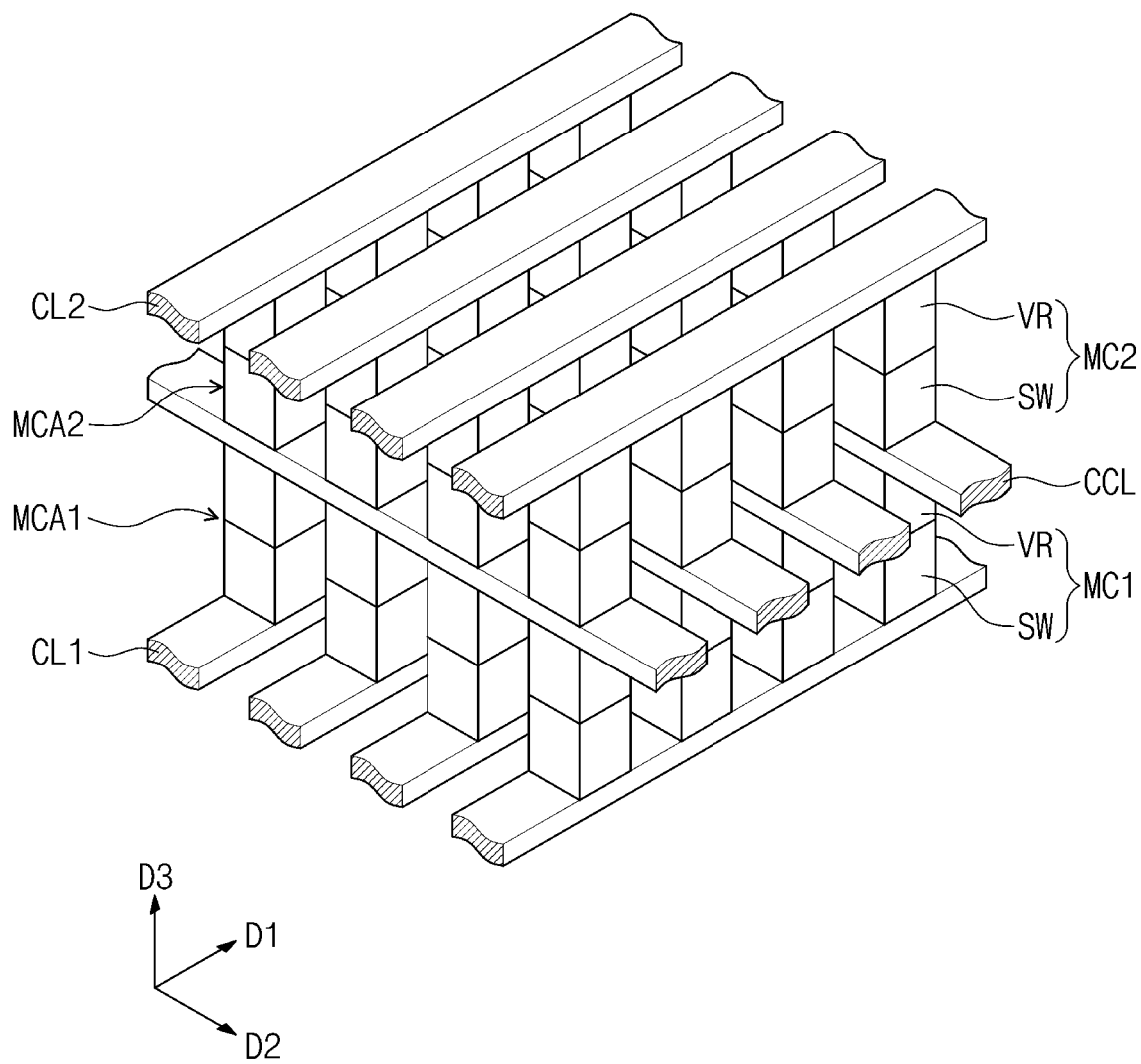
FIG. 3 is a perspective view illustrating a memory cell array of a 3D semiconductor memory device according to exemplary embodiments of the inventive concept.

FIG. 3 is a perspective view illustrating a memory cell array of a 3D semiconductor memory device according to exemplary embodiments of the inventive concept.

Referring to FIG. 3, a second memory cell array layer MCA2 may be disposed on a first memory cell array layer MCA1. The first memory cell array layer MCA1 may be provided between first conductive lines CL and common conductive lines CCL, and the second memory cell array layer MCA2 may be provided between second conductive lines CL2 and the common conductive lines CCL.

The first conductive lines CL1 and the second conductive lines CL2 may extend in a first direction D1, and the common conductive lines CCL may extend in a second direction D2 intersecting the first direction D1.

The first memory cell array layer MCA1 may include first memory cells MC1 provided at intersection points of the first conductive lines CL1 and the common conductive lines CCL, respectively. The first memory cells MC1 may be spaced apart from each other in the first direction D1 and the second direction D2.

The second memory cell array layer MCA2 may include second memory cells MC2 provided at intersection points of the common conductive lines CCL and the second conductive lines CL2, respectively. The second memory cells MC2 may be spaced apart from each other in the first direction D1 and the second direction D2.

Each of the first and second memory cells MC1 and MC2 may include a switching element SW and a variable resistor VR. The switching element SW and the variable resistor VR may be connected in series to each other between a pair of conductive lines CL1 and CCL (or CCL and CL2) connected thereto.

In exemplary embodiments of the inventive concept, the variable resistor VR of the first memory cell MC1 and the switching element SW of the second memory cell MC2 may be connected in common to a corresponding common conductive line CCL. In exemplary embodiments of the inventive concept, the variable resistor VR of the first memory cell MC1 and the variable resistor VR of the second memory cell MC2 may be connected in common to a corresponding common conductive line CCL. In exemplary embodiments of the inventive concept, the switching element SW of the first memory cell MC1 and the switching element SW of the second memory cell MC2 may be connected in common to a corresponding common conductive line CCL.

Figure 4:
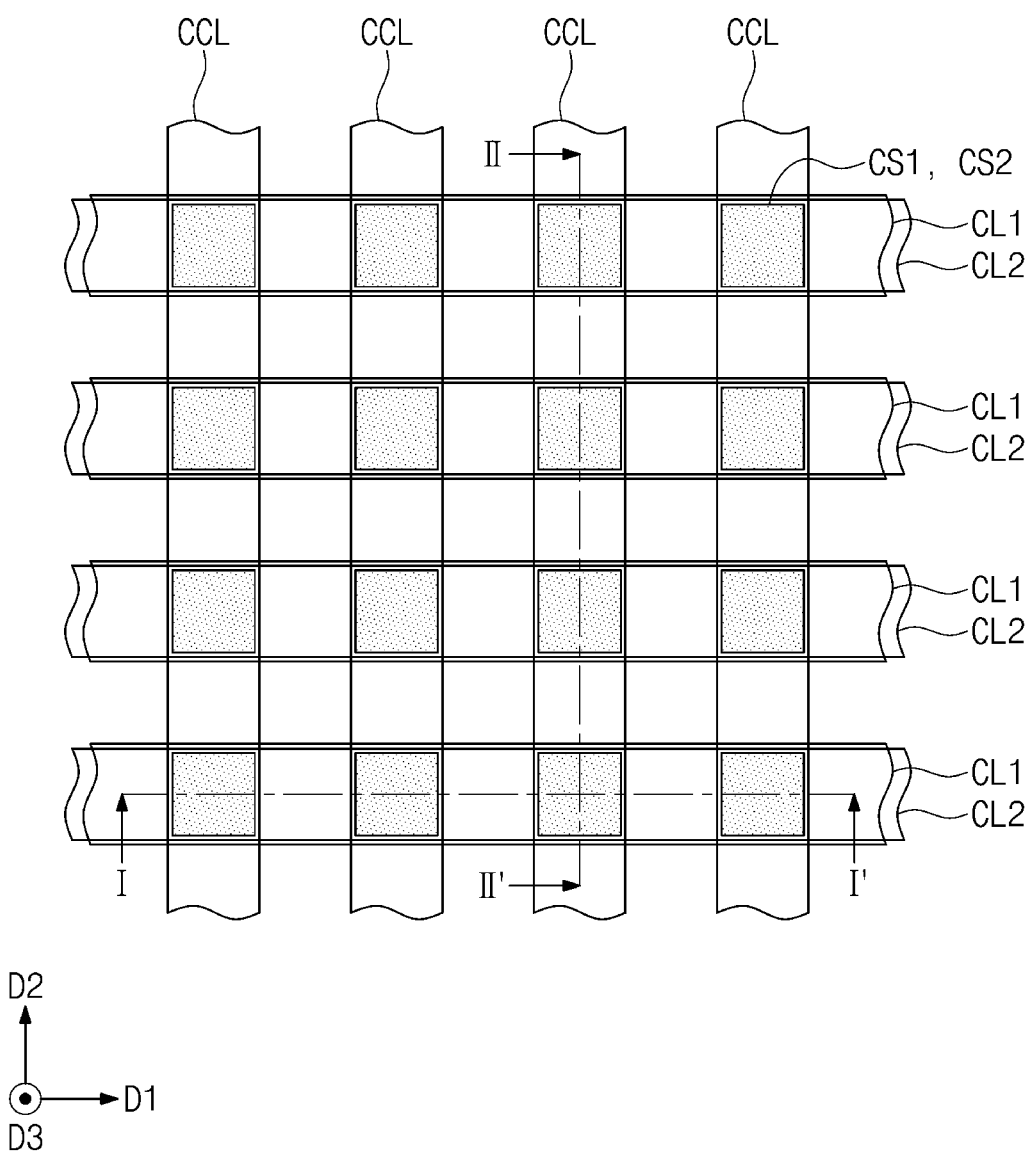
FIG. 4 is a plan view illustrating a 3D semiconductor memory device according to exemplary embodiments of the inventive concept.
Figure 5A:
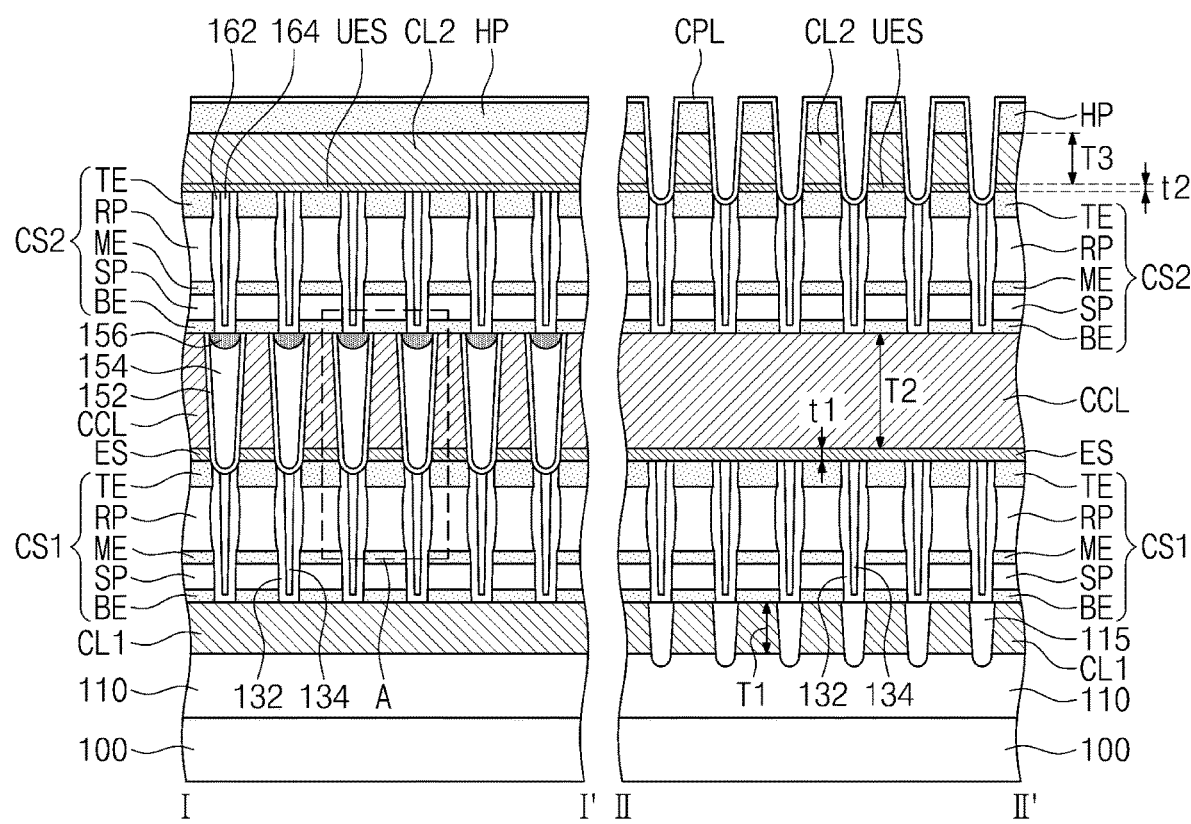
FIGS. 5A and 5B are cross-sectional views taken along lines I-I' and II-II' of FIG. 4 to illustrate 3D semiconductor memory devices according to exemplary embodiments of the inventive concept.
Figure 5B:
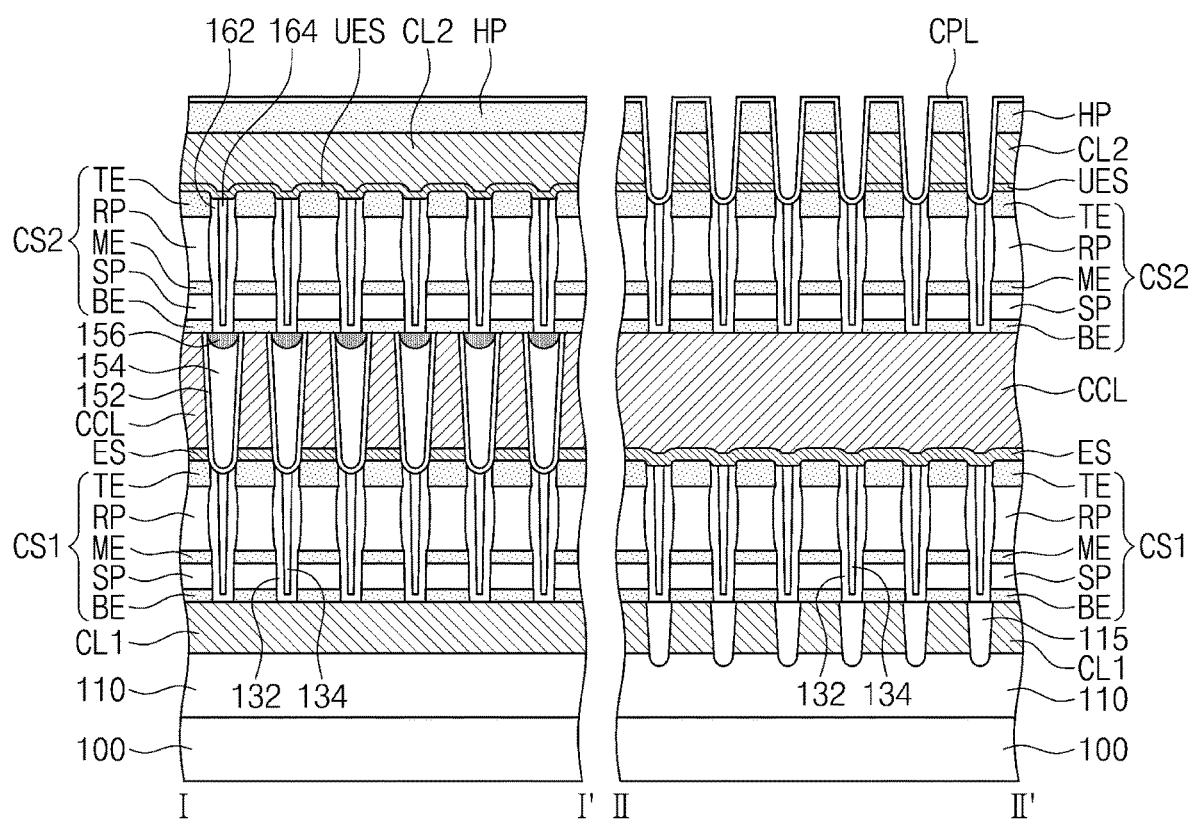

FIG. 4 is a plan view illustrating a 3D semiconductor memory device according to exemplary embodiments of the inventive concept. FIGS. 5A and 5B are cross-sectional views taken along lines I-I' and II-II' of FIG. 4 to illustrate 3D semiconductor memory devices according to exemplary embodiments of the inventive concepts. FIGS. 6A, 6B, 6C, 6D and 6E are enlarged views of a portion 'A' of FIG. 5A.

Referring to FIGS. 4 and 5A, first conductive lines CL1 extending in a first direction D1 may be disposed on a substrate 100 and may be spaced apart from each other in a second direction D2. The first direction D1 and the second direction D2 may be parallel to a top surface of the substrate 100 and may intersect each other.

Common conductive lines CCL may be spaced apart from the first conductive lines CL1 in a third direction D3 perpendicular to the top surface of the substrate 100. The common conductive lines CCL may extend in the second direction D2 and may be spaced apart from each other in the first direction D1.

Second conductive lines CL2 may be spaced apart from the common conductive lines CCL in the third direction D3. The second conductive lines CL2 may extend in the first direction D1 and may be spaced apart from each other in the second direction D2.

The first conductive lines CL1, the common conductive lines CCL and the second conductive lines CL2 may include a metal (e.g., copper, tungsten, or aluminum) and/or a metal nitride (e.g., tantalum nitride, titanium nitride, or tungsten nitride). For example, the first conductive lines CL1, the common conductive lines CCL and the second conductive lines CL2 may include the same metal material.

An interlayer insulating layer 110 may be provided between the substrate 100 and the first conductive lines CL1. For example, the interlayer insulating layer 110 may include at least one of silicon oxide, silicon nitride, or silicon oxynitride.

Lower insulating patterns 115 may fill spaces between the first conductive lines CL1. Top surfaces of the lower insulating patterns 115 may be located at substantially the same level as top surfaces of the first conductive lines CL1. Lower portions of the lower insulating patterns 115 may be disposed in the interlayer insulating layer 110. Bottom surfaces of the lower insulating patterns 115 may be located at a lower level than bottom surfaces of the first conductive lines CL1. For example, the lower insulating patterns 115 may protrude into the interlayer insulating layer 110. The lower insulating patterns 115 may include at least one of silicon oxide, silicon nitride, or silicon oxynitride.

First cell stacks CS1 may be disposed at intersection points of the first conductive lines CL1 and the common conductive lines CCL, respectively. In other words, the first cell stacks CS1 may be spaced apart from each other in the first direction D1 on each of the first conductive lines CL1. A top width of each of the first cell stacks CS1 may be less than a bottom width of each of the first cell stacks CS1. Alternatively, the top width of each of the first cell stacks CS1 may be substantially equal to the bottom width of each of the first cell stacks CS1.

Each of the first cell stacks CS1 may include a switching pattern SP provided between the first conductive line CL1 and the common conductive line CCL, and a variable resistance pattern RP provided between the switching pattern SP and the common conductive line CCL.

In exemplary embodiments of the inventive concept, each of the first cell stacks CS1 may include a first electrode BE, the switching pattern SP, a second electrode ME, the variable resistance pattern RP and a third electrode TE, which are sequentially stacked. Hereinafter, the switching pattern SP disposed between the first and second electrodes BE and ME and the variable resistance pattern RP disposed between the second and third electrodes ME and TE will be described as an example. Alternatively, the variable resistance pattern RP may be disposed between the first electrode BE and the second electrode ME, and the switching pattern SP may be disposed between the second electrode ME and the third electrode TE.

Figure 6A:
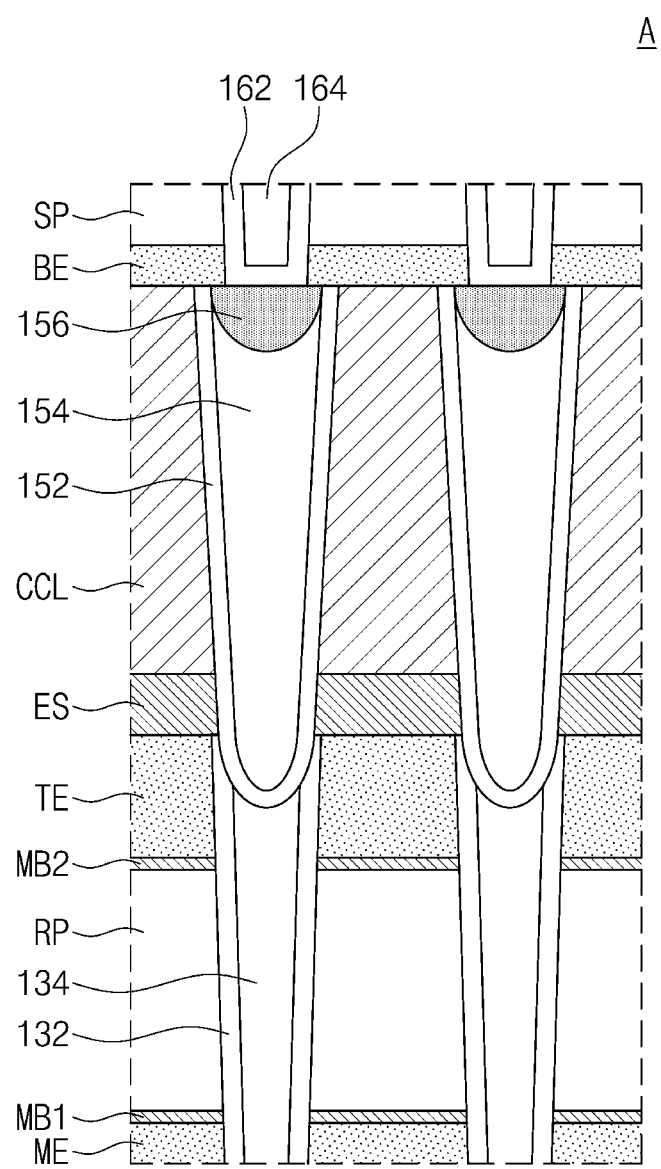
FIGS. 6A, 6B, 6C, 6D and 6E are enlarged views of a portion 'A' of FIG. 5A.
Figure 6B:
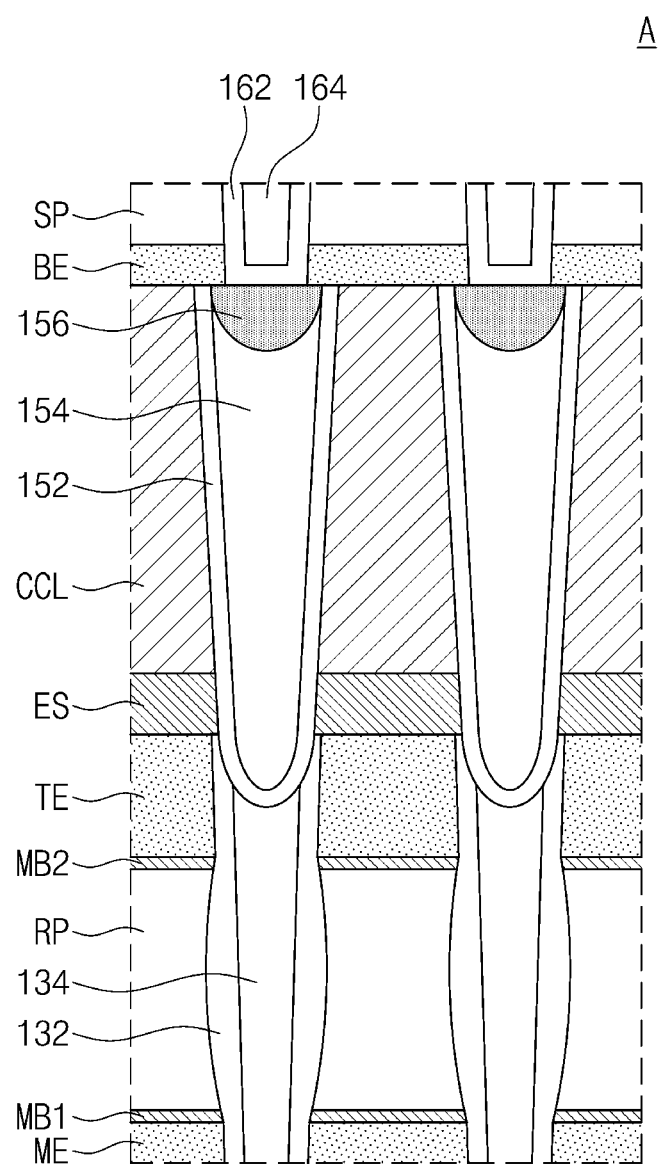

The variable resistance patterns RP of the first cell stacks CS1 may have inclined sidewalls, as illustrated in FIG. 6A. Alternatively, the variable resistance patterns RP of the first cell stacks CS1 may have rounded sidewalls, as illustrated in FIG. 6B. For example, the variable resistance patterns RP of the first cell stacks CS1 in FIG. 6B may be curved.

The variable resistance patterns RP of the first cell stacks CS1 may be formed of at least one of materials having properties capable of storing data. When the 3D semiconductor memory device according to exemplary embodiments of the inventive concept is a phase change memory device, the variable resistance patterns RP may include a material of which a phase is reversibly changeable between a crystalline phase and an amorphous phase by a temperature. For example, a phase transition temperature between the crystalline and amorphous phases of the variable resistance patterns RP may range from about 250 degrees Celsius to about 350 degrees Celsius. The variable resistance patterns RP may be formed of a compound that includes at least one of Te or Se (e.g., chalcogenide elements) and at least one of Ge, Sb, Bi, Pb, Sn, Ag, As, S, Si, In, Ti, Ga, P, O, or C. The variable resistance patterns RP may further include a light element in addition to the compound. For example, the light element may include at least one of C, N, O, P, Cd, W, Ti, Hf, or Zr. For example, the variable resistance patterns RP may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. In exemplary embodiments of the inventive concept, the variable resistance patterns RP may have a superlattice structure in which layers including Ge and layers not including Ge are repeatedly and alternately stacked. For example, the variable resistance patterns RP may have a structure in which GeTe layers and SbTe layers are repeatedly and alternately stacked.

In exemplary embodiments of the inventive concept, the variable resistance patterns RP may include at least one of perovskite compounds or conductive metal oxides. For example, the variable resistance patterns RP may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, or barium-strontium-zirconium oxide. When the variable resistance patterns RP include a transition metal oxide, a dielectric constant of the variable resistance patterns RP may be greater than a dielectric constant of silicon oxide.

In exemplary embodiments of the inventive concept, the variable resistance patterns RP may have a double-layer structure of a conductive metal oxide layer and a tunnel insulating layer or may have a triple-layer structure of a first conductive metal oxide layer, a tunnel insulating layer and a second conductive metal oxide layer. The tunnel insulating layer may include aluminum oxide, hafnium oxide, or silicon oxide.

Each of the switching patterns SP of the first cell stacks CS1 may be an ovonic threshold switch (OTS) element having a bi-directional characteristic. For example, each of the switching patterns SP may be an element based on a threshold switching phenomenon having a nonlinear I-V curve (e.g., a S-shaped I-V curve). The switching patterns SP may have a phase transition temperature between crystalline and amorphous phases, which is higher than that of the variable resistance patterns RP. For example, the phase transition temperature of the switching patterns SP may range from about 350 degrees Celsius to about 450 degrees Celsius. Thus, when the 3D semiconductor memory device according to exemplary embodiments of the inventive concept is operated, the phases of the variable resistance patterns RP may be reversibly changed between the crystalline and amorphous phases by an operating voltage (e.g., a program voltage), but the switching patterns SP may be maintained in a substantially amorphous state without a phase change even though the operating voltage is applied thereto. In the present specification, the term 'substantially amorphous state' may include an amorphous state and may also include a case in which a grain boundary or a crystallized portion locally exists in a portion of a component.

The switching patterns SP may be formed of a compound that includes at least one of Te or Se (e.g., a chalcogenide element) and at least one of Ge, Sb, Bi, Al, Pb, Sn, Ag, As, S, Si, In, Ti, Ga, or P. The switching patterns SP may further include a thermal stabilization element in addition to the compound. The thermal stabilization element may include at least one of B, C, N, or O. For example, the switching patterns SP may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

The first, second and third electrodes BE, ME and TE may include a conductive material. For example, the first, second and third electrodes BE, ME and TE may be carbon electrodes including carbon. The first, second and third electrodes BE, ME and TE may include a metal and/or a metal nitride. A width of each of the first electrodes BE may be substantially equal to or greater than a width of the first conductive line CL1 provided thereunder.

In exemplary embodiments of the inventive concept, each of the first cell stacks CS1 may include a first metal pattern MB1 between the second electrode ME and the variable resistance pattern RP, and a second metal pattern MB2 between the third electrode TE and the variable resistance pattern RP, as illustrated in FIGS. 6A to 6E. The first and second metal patterns MB1 and MB2 may cover a bottom surface and a top surface of the variable resistance pattern RP to prevent diffusion of the material of the variable resistance pattern RP. For example, the first metal pattern MB1 may directly contact the bottom surface of the variable resistance pattern RP and the second metal pattern MB2 may directly contact the top surface of the variable resistance pattern RP. In addition, the first metal pattern MB1 may be provided between the variable resistance pattern RP and the switching pattern SP to reduce a contact resistance therebetween. For example, the first and second metal patterns MB1 and MB2 may include at least one of W, Ti, Al, Cu, C, CN, TiN, TiAlN, TiSiN, TiCN, WN, CoSiN, WSiN, TaN, TaCN, or TaSiN.

A first filling insulation pattern 134 may fill a space between the first cell stacks CS1. The first filling insulation pattern 134 may extend in the first direction D1 and the second direction D2 to insulate the first cell stacks CS1 from each other in the first direction D1 and the second direction D2. The first filling insulation pattern 134 may include a low-k dielectric layer. For example, the first filling insulation pattern 134 may include at least one of SiN, SiON, SiC, SiCN, SiOC, SiOCH, SiOCN, SiOF, SiO$_2$, or Al$_2$O$_3$.

A top surface of the first filling insulation pattern 134 between the first cell stacks CS1 adjacent to each other in the first direction D1 may be located at a lower level than top surfaces of the first cell stacks CS1. In the alternative, the top surface of the first filling insulation pattern 134 may be at the same level as the top surface of one of the first cell stacks CS1. In addition, the first filling insulation pattern 134 may have a rounded top surface between the first cell stacks CS1 adjacent to each other in the first direction D1.

A first capping pattern 132 may be disposed between the first filling insulation pattern 134 and sidewalls of the first cell stacks CS1. The first capping pattern 132 may be in direct contact with sidewalls of the variable resistance patterns RP and the switching patterns SP of the first cell stacks CS1. A lower portion of the first capping pattern 132 may be disposed between a bottom surface of the first filling insulation pattern 134 and the top surfaces of the lower insulating patterns 115. In addition a lower portion of the first capping pattern 132 may be disposed between the bottom surface of the first filling insulation pattern 134 and the top surfaces of the first conductive lines CL1. The first capping pattern 132 may cover the sidewalls of the first cell stacks CS1 and the bottom surface of the first filling insulation pattern 134 with a substantially uniform thickness. The first capping pattern 132 may include a different insulating material from that of the first filling insulation pattern 134. For example, the first capping pattern 132 may include silicon nitride and/or silicon oxynitride.

The common conductive lines CCL may extend in the second direction D2 on the first cell stacks CS1. The common conductive lines CCL may include the same metal material as the first conductive lines CL1. Each of the common conductive lines CCL may have a second thickness T2, and the second thickness T2 may be at least twice a first thickness T1 of the first conductive lines CL1. For example, the second thickness T2 of each of the common conductive lines CCL may range from about 800 Å to about 1000 Å. A top width of the common conductive line CCL may be less than a bottom width of the common conductive line CCL. For example, the common conductive line CCL may be tapered. Since the common conductive lines CCL connected in common to the first and second cell stacks CS1 and CS2 are thicker than the first conductive lines CL1 connected to the first cell stacks CS1 or the second conductive lines CL2 connected to the second cell stacks CS2, resistances of the common conductive lines CCL may be reduced. Thus, electrical characteristics of the 3D semiconductor memory device may be improved in an operating mode.

An etch stop pattern ES may be disposed between each of the common conductive lines CCL and the first cell stacks CS1 arranged in the second direction D2. The etch stop pattern ES may extend in the second direction D2 in parallel to the common conductive line CCL. The etch stop pattern ES may be formed of a conductive material having an etch selectivity with respect to the common conductive lines CCL. For example, the etch stop pattern ES may include Ti, Ta, TiN, TaN, AlN, or any combination thereof. A thickness t1 of the etch stop pattern ES may be less than a thickness of the third electrode TE of the first cell stack CS1. The etch stop pattern ES may have a thickness of about 100 Å to about 200 Å.

Figure 6C:
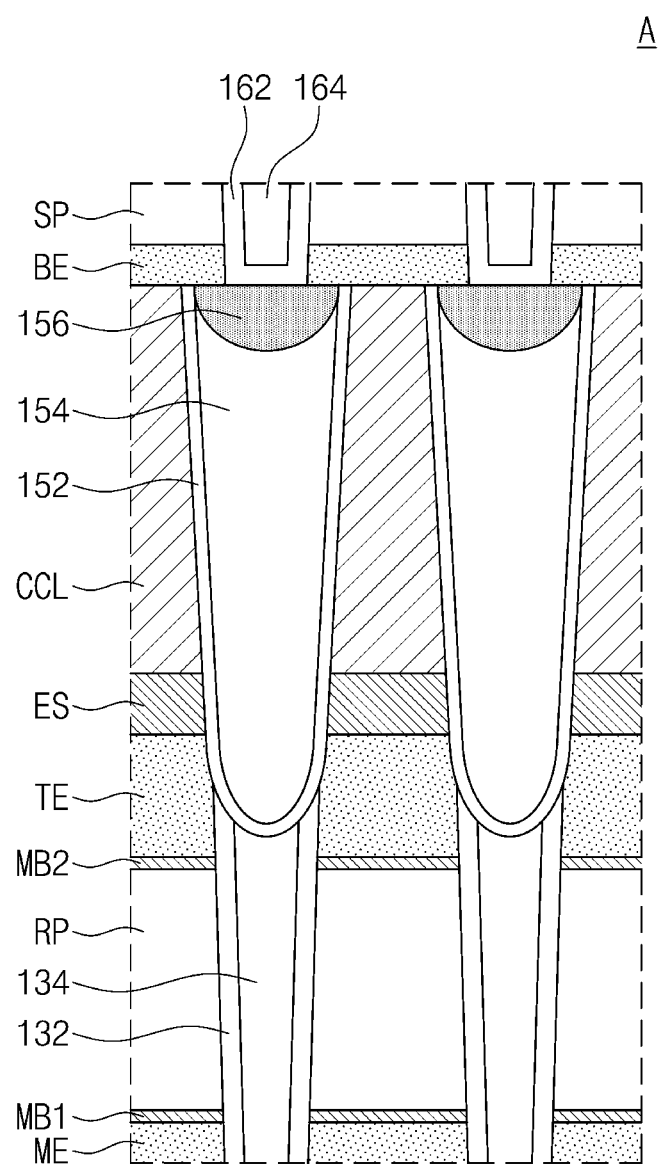
Figure 6D:
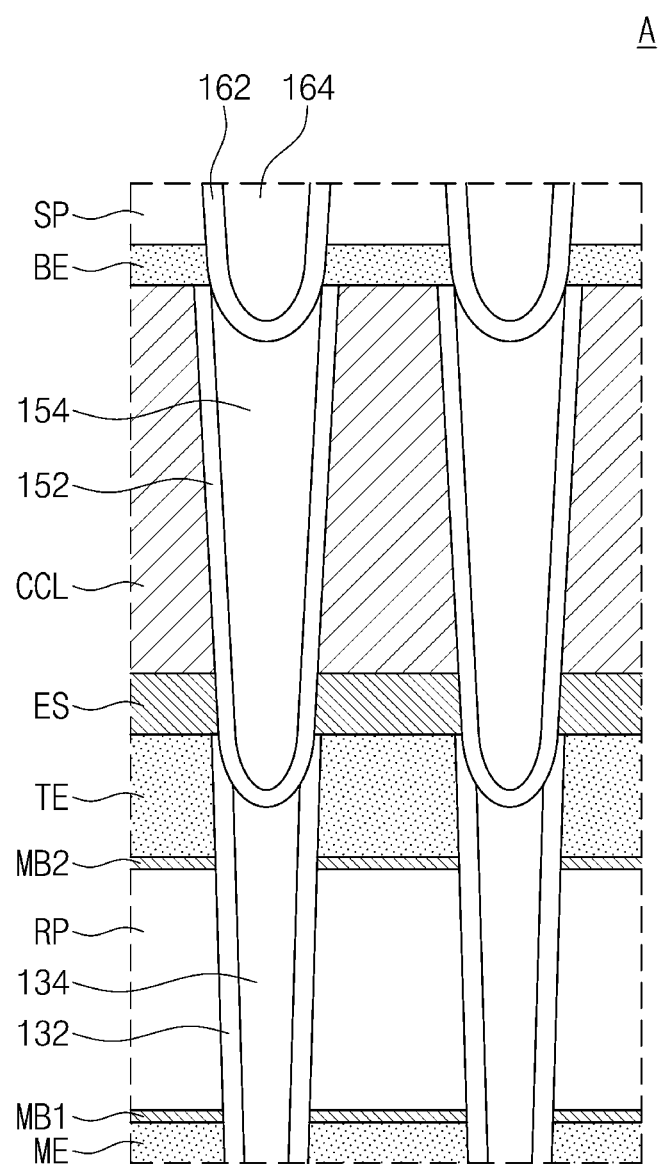
Figure 6E:
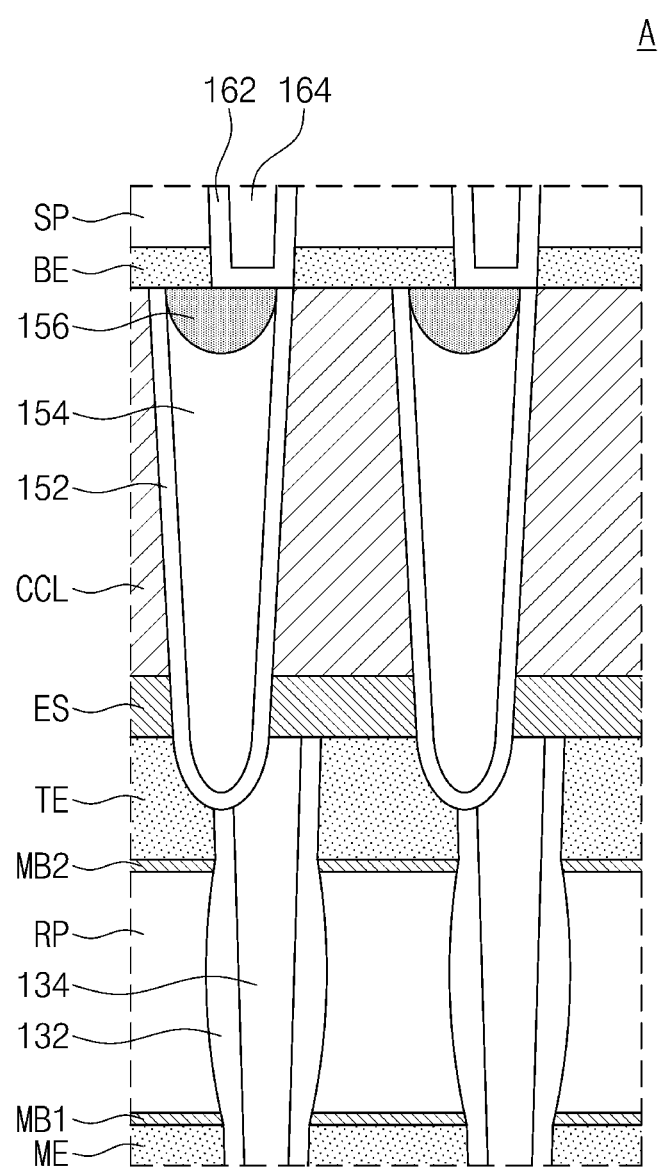

A top surface of the etch stop pattern ES may be in contact with a bottom surface of the common conductive line CCL, and a bottom surface of the etch stop pattern ES may be in contact with top surfaces of the third electrodes TE of the first cell stacks CS1. The bottom surface of the etch stop pattern ES may be in contact with the whole of the top surface of the third electrode TE of each of the first cell stacks CS1, as illustrated in FIG. 6A. Alternatively, as illustrated in FIG. 6E, a portion of the bottom surface of the etch stop pattern ES may be in contact with a portion of the first capping pattern 132 and a portion of the first filling insulation pattern 134.

The etch stop pattern ES may be in contact with a portion of the first filling insulation pattern 134 between the first cell stacks CS1 adjacent to each other in the second direction D2. A top width of the etch stop pattern ES may be substantially equal to or greater than the bottom width of the common conductive line CCL. A bottom width of the etch stop pattern ES may be substantially equal to or greater than the top width of the first cell stack CS1.

Second filling insulation patterns 154 may fill spaces between the common conductive lines CCL and between the etch stop patterns ES. Bottom surfaces of the second filling insulation patterns 154 may be located at a lower level than the bottom surfaces of the etch stop patterns ES. For example, bottom surfaces of the second filling insulation patterns 154 may be disposed between adjacent third electrodes TE of the first cell stacks CS1. The second filling insulation patterns 154 may extend in the second direction D2 in parallel to the common conductive lines CCL. The second filling insulation patterns 154 may include a low-k dielectric layer. For example, the second filling insulation patterns 154 may include at least one of a SiC layer, a SiCN layer, a SiOCH layer, a SIOC layer, or a SiOF layer.

Top surfaces of the second filling insulation patterns 154 may be located at a lower level than top surfaces of the common conductive lines CCL. Alternatively, the top surfaces of the second filling insulation patterns 154 may be located at substantially the same level as the top surfaces of the common conductive lines CCL. The second filling insulation patterns 154 may have rounded top surfaces at a lower level than the top surfaces of the common conductive lines CCL Buffer insulating patterns 156 may be provided on the top surfaces of the second filling insulation patterns 154. The buffer insulating patterns 156 may be disposed between upper portions of the common conductive lines CCL. Top surfaces of the buffer insulating patterns 156 may be located at substantially the same level as the top surfaces of the common conductive lines CCL.

A second capping pattern 152 may be disposed between the second filling insulation pattern 154 and sidewalls of the common conductive lines CCL. In addition, the second capping pattern 152 may be disposed between the second filling insulation pattern 154 and sidewalls of the etch stop patterns ES. The second capping pattern 152 may have a substantially uniform thickness and may continuously extend from the sidewall of the common conductive line CCL onto the sidewall of the etch stop pattern ES. A thickness of the second capping pattern 152 may be substantially equal to or less than a thickness of the first capping pattern 132. A portion of the second capping pattern 152 may be disposed between the bottom surface of the second filling insulation pattern 154 and the top surface of the first filling insulation pattern 134. For example, this portion of the second capping pattern 152 may contact the first filling insulation pattern 134. The second capping pattern 152 may include a different insulating material from that of the first filling insulation pattern 134. For example, the second capping pattern 152 may include silicon nitride and/or silicon oxynitride.

Referring to FIG. 6A, the second capping pattern 152 may be in contact with a top surface of the first capping pattern 132 and the top surface of the first filling insulation pattern 134. A bottom surface of the second capping pattern 152 may be located at a level between the top and bottom surfaces of the third electrode TE of the first cell stack CS1. The second capping pattern 152 may be spaced apart from the third electrodes TE of the first cell stacks CS1. Alternatively, as illustrated in FIG. 6C, a portion of the second capping pattern 152 may be in contact with a portion of the sidewall of the third electrode TE of the first cell stack CS1.

The second cell stacks CS2 may be disposed at intersection points of the second conductive lines CL2 and the common conductive lines CCL, respectively. In other words, the second cell stacks CS2 may be spaced apart from each other in the second direction D2 on each of the common conductive lines CCL.

The second cell stacks CS2 may have substantially the same stack structure as the first cell stacks CS1. For example, each of the second cell stacks CS2 may include a first electrode BE, a switching pattern SP, a second electrode ME, a variable resistance pattern RP and a third electrode TE, which are sequentially stacked.

The first electrodes BE of the second cell stacks CS2 may be in contact with the top surface of a corresponding common conductive line CCL. A bottom width of the second cell stack CS2 may be greater than the top width of the common conductive line CCL.

A third filling insulation pattern 164 may fill a space between the second cell stacks CS2. The third filling insulation pattern 164 may extend in the first direction D1 and the second direction D2 to insulate the second cell stacks CS2 from each other in the first direction D1 and the second direction D2. The third filling insulation pattern 164 may include a low-k dielectric layer. For example, the third filling insulation pattern 164 may include at least one of a SiC layer, a SiCN layer, a SiOCH layer, a SiOC layer, or a SiOF layer.

A top surface of the third filling insulation pattern 164 between the second cell stacks CS2 adjacent to each other in the second direction D2 may be located at a lower level than top surfaces of the second cell stacks CS2. In the alternative, the top surface of the third filling insulation pattern 164 may be at the same level as a top surface of the one of the second cell stacks CS2. In addition, the third filling insulation pattern 164 may have a rounded top surface between the second cell stacks CS2 adjacent to each other in the second direction D2.

A third capping pattern 162 may be disposed between the third filling insulation pattern 164 and sidewalls of the second cell stacks CS2. A lower portion of the third capping pattern 162 may be disposed between the third filling insulation pattern 164 and the second filling insulation pattern 154. In addition, a lower portion of the third capping pattern 162 may be disposed between the third filling insulation pattern 164 and the common conductive line CCL. The third capping pattern 162 may cover the sidewalls of the second cell stacks CS2 and a bottom surface of the third filling insulation pattern 164 with a substantially uniform thickness.

The buffer insulating pattern 156 may be disposed between the lower portion of the third capping pattern 162 and the second filling insulation pattern 154. In other words, a bottom surface of the third capping pattern 162 may be in direct contact with the buffer insulating pattern 156. Alternatively, as illustrated in FIG. 6D, the bottom surface of the third capping pattern 162 may be in direct contact with the second filling insulation pattern 154.

The bottom surface of the third capping pattern 162 may be located at substantially the same level as the top surfaces of the common conductive lines CCL, as illustrated in FIG. 6A. Alternatively, as illustrated in FIG. 61D, the bottom surface of the third capping pattern 162 may be located at a lower level than the top surfaces of the common conductive lines CCL. For example, the bottom surface of the third capping pattern 162 may protrude to an area between adjacent common conductive lines CCL.

The third capping pattern 162 may include a different insulating material from that of the third filling insulation pattern 164. For example, the third capping pattern 162 may include silicon nitride and/or silicon oxynitride.

The second conductive lines CL2 may extend in the first direction D1 on the second cell stacks CS2. The second conductive lines CL2 may include the same metal material as the first conductive lines CL1. The second conductive lines CL2 may be thinner than the common conductive lines CCL. For example, the second conductive lines CL2 may have a third thickness T3 substantially equal to the first thickness T1 of the first conductive lines CL1.

An upper etch stop pattern UES may be disposed between each of the second conductive lines CL2 and the second cell stacks CS2. The upper etch stop pattern UES may extend in the first direction D1 in parallel to the second conductive line CL2. The upper etch stop pattern UES may be in direct contact with top surfaces of the third electrodes TE of the second cell stacks CS2 arranged in the first direction D1. The upper etch stop pattern UES may be formed of a conductive material having an etch selectivity with respect to the second conductive lines CL2. For example, the upper etch stop pattern UES may include Ti, Ta, TiN, TaN, AlN, or any combination thereof. The thickness t1 of the etch stop pattern ES may be less than the thickness of the third electrode TE of the first cell stack CS1. A thickness t2 of the upper etch stop pattern UES may be less than the thickness t1 of the etch stop pattern ES. In exemplary embodiments of the inventive concept, the upper etch stop pattern UES may be omitted, and each of the second conductive lines CL2 may be in direct contact with the top surfaces of the second cell stacks CS2 arranged in the first direction D1.

A hard mask pattern HP may be disposed on each of the second conductive lines CL2. For example, the hard mask pattern HP may include silicon nitride and/or silicon oxynitride.

An upper capping layer CPL may cover sidewalls of the hard mask patterns HP, sidewalls of the second conductive lines CL2 and sidewalls of the upper etch stop patterns UES with a substantially uniform thickness. Portions of the upper capping layer CPL may cover a top surface of the third filling insulation pattern 164 between the second conductive lines CL2.

According to exemplary embodiments of the inventive concept illustrated in FIG. 5B, a top surface of the first filling insulation pattern 134 may be located at a lower level than the top surfaces of the first cell stacks CS1 adjacent to each other in the second direction D2. The etch stop pattern ES may extend in the second direction D2 and may conformally cover the top surfaces of the first cell stacks CS1 and the top surface of the first filling insulation pattern 134. In other words, the etch stop pattern ES may have a non-flat top surface. The common conductive line CCL may be disposed on the etch stop pattern ES and may have a flat top surface.

A top surface of the third filling insulation pattern 164 may be located at a lower level than the top surfaces of the second cell stacks CS2 adjacent to each other in the first direction D1. The upper etch stop pattern UES may extend in the first direction D1 and may conformally cover the top surfaces of the second cell stacks CS2 and the top surface of the third filling insulation pattern 164. The second conductive line CL2 may be disposed on the upper etch stop pattern UES and may have a flat top surface.

According to an exemplary embodiment of the inventive concept, a 3D semiconductor memory device shown in FIGS. 1-6E may include: first cell stacks CS1, second cell stacks CS2 disposed on the first cell stacks CS1; first conductive lines CL1 provided between the substrate 100 and the first cell stacks CS1; common conductive lines CCL provided between the first cell stacks CS1 and the second cell stacks CS2; etch stop patterns ES provided between the common conductive lines CCL and top surfaces of the first cell stacks CS1, the etch stop patterns ES including a conductive material; second conductive lines CL2 provided on the second cell stacks CS2; and a capping pattern 152 covering a sidewall of the common conductive lines CCL and a sidewall of the etch stop patterns ES, wherein each of the common conductive lines CCL has a second thickness T2 greater than a first thickness T1 of each of the first conductive lines CL1.

Figure 7:
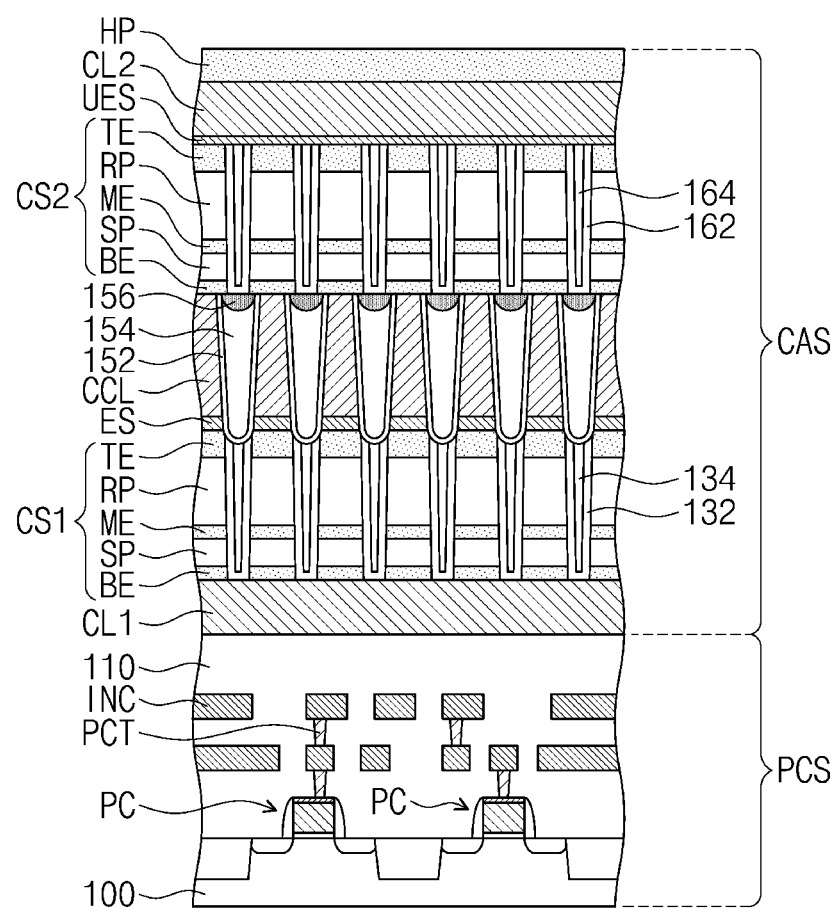
FIG. 7 is a cross-sectional view illustrating a 3D semiconductor memory device according to exemplary embodiments of the inventive concept.

FIG. 7 is a cross-sectional view illustrating a 3D semiconductor memory device according to exemplary embodiments of the inventive concept. Hereinafter, the same components as in the above embodiments may be indicated by the same reference numerals or the same reference designators, and the descriptions thereto may be omitted or mentioned briefly for convenience in explanation.

Referring to FIG. 7, a 3D semiconductor memory device according to exemplary embodiments of the inventive concept may include a peripheral circuit structure PCS and a cell array structure CAS on the peripheral circuit structure PCS.

The peripheral circuit structure PCS may include peripheral logic circuits PC integrated on a top surface of a substrate 100, and an interlayer insulating layer 110 covering the peripheral logic circuits PC.

The substrate 100 may include a silicon substrate, a silicon-germanium substrate, a germanium substrate, or a single-crystalline epitaxial layer grown on a single-crystalline silicon substrate. The substrate 100 may include active regions defined by a device isolation layer.

The peripheral logic circuits PC may include row and column decoders, a page buffer, and/or a control circuit. More particularly, the peripheral logic circuits PC may include a gate insulating layer on the substrate 100, a gate electrode on the gate insulating layer, and source/drain regions disposed in the active region at both sides of the gate electrode. For example, the peripheral logic circuits PC may include a transistor.

Peripheral circuit interconnection lines INC may be electrically connected to the peripheral logic circuits PC through peripheral contact plugs PCT. For example, the peripheral contact plugs PCT and the peripheral circuit interconnection lines INC may be connected to n-type metal oxide semiconductor (NMOS) and p-type metal oxide semiconductor (PMOS) transistors.

The interlayer insulating layer 110 may be provided on an entire top surface of the substrate 100. In other words, the interlayer insulating layer 110 may cover the entire top surface of the substrate 100. The interlayer insulating layer 110 may cover the peripheral logic circuits PC, the peripheral contact plugs PCT, and the peripheral circuit interconnection lines INC on the substrate 100. The interlayer insulating layer 110 may include a plurality of stacked insulating layers. For example, the interlayer insulating layer 110 may include at least one of a silicon oxide layer, a silicon nitride layer, a silicon oxynitride layer, or a low-k dielectric layer.

The cell array structure CAS may be disposed on the interlayer insulating layer 110. The cell array structure CAS may include the vertically stacked cell array layers described above. In other words, the cell array structure CAS may include the first conductive lines CL1, the first cell stacks CS1, the common conductive lines CCL, the second cell stacks CS2, and the second conductive lines CL2, described above with reference to FIGS. 5A and 5B.

FIGS. 8 to 11 are cross-sectional views taken along the lines I-I' and II-II' of FIG. 4 to illustrate 3D semiconductor memory devices according to exemplary embodiments of the inventive concept. FIG. 12 is an enlarged view of a portion 'B' of FIG. 10. Hereinafter, the same components as in the above embodiments may be indicated by the same reference numerals or the same reference designators, and the descriptions thereto may be omitted or mentioned briefly for convenience in explanation.

Figure 8:
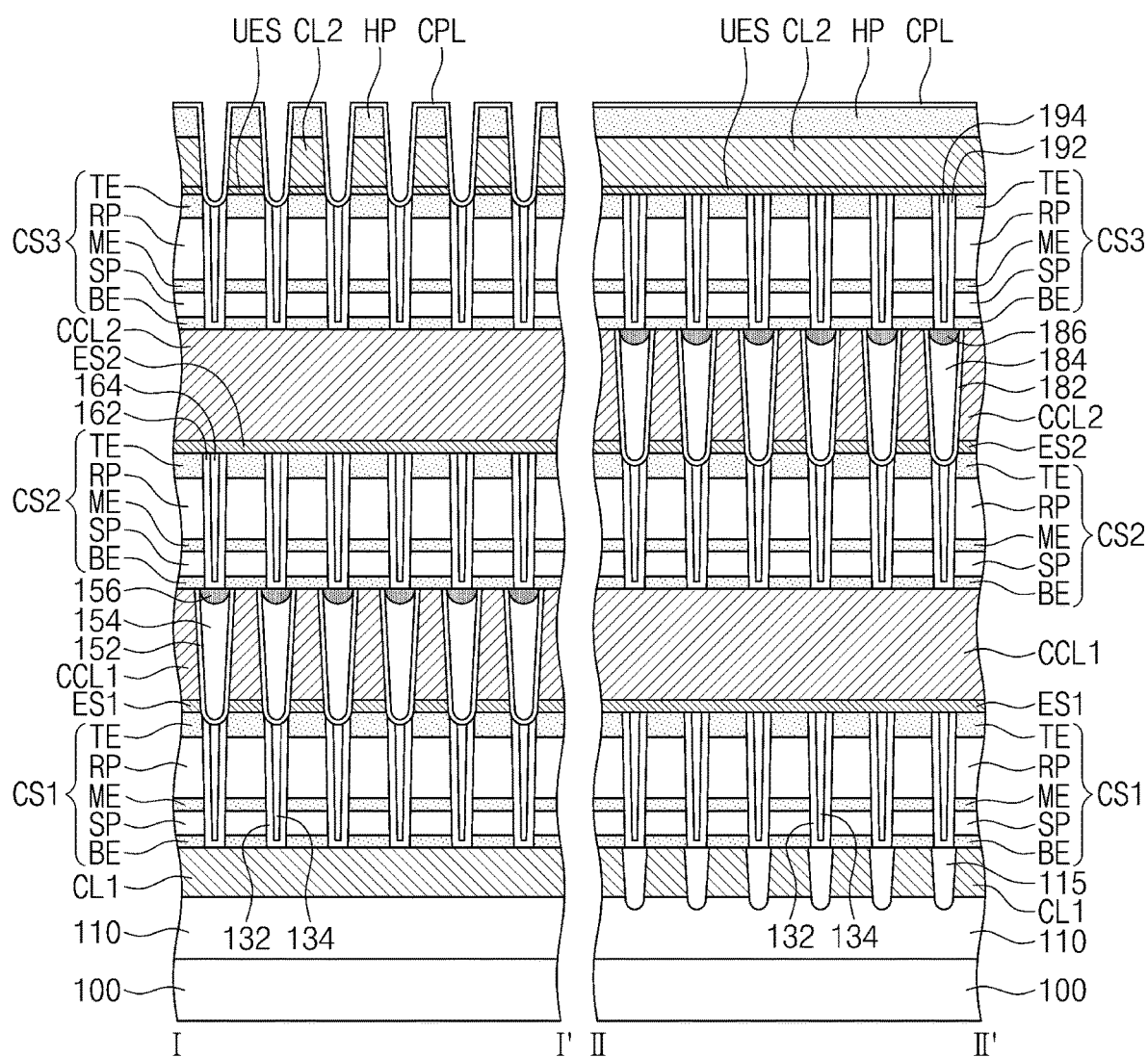
FIGS. 8, 9, 10 and 11 are cross-sectional views taken along the lines I-I' and II-II' of FIG. 4 to illustrate 3D semiconductor memory devices according to exemplary embodiments of the inventive concept.

Referring to FIG. 8, a 3D semiconductor memory device may include first, second and third cell stacks CS1, CS2 and CS3 vertically stacked on the substrate 100. The first cell stacks CS1 and the second cell stacks CS2 may share first common conductive lines CCL1, and the second cell stacks CS2 and the third cell stacks CS3 may share second common conductive lines CCL2. In other words, the first common conductive lines CCL1 are disposed between the first and second cell stacks CS1 and CS2, and the second common conductive lines CCL2 are disposed between the second and third cell stacks CS2 and CS3.

The first common conductive lines CCL1 may extend in the second direction D2 to intersect the first conductive lines CL1, and the second common conductive lines CCL2 may extend in the first direction D1 to intersect the first common conductive lines CCL1. Second conductive lines CL2 may extend in the second direction D2 to intersect the second common conductive lines CCL2.

The first cell stacks CS1 may be disposed at intersection points of the first conductive lines CL1 and the first common conductive lines CCL1, respectively. The first filling insulation pattern 134 may fill the space between the first cell stacks CS1. The first capping pattern 132 may cover the sidewalls of the first cell stacks CS1 with a substantially uniform thickness and may be disposed between the bottom surface of the first filling insulation pattern 134 and the first conductive line CL1.

The second cell stacks CS2 may be disposed at intersection points of the first common conductive lines CCL1 and the second common conductive lines CCL2, respectively. The third filling insulation pattern 164 may fill the space between the second cell stacks CS2. The third capping pattern 162 may cover the sidewalls of the second cell stacks CS2 with a substantially uniform thickness and may be disposed between the third filling insulation pattern 164 and a first buffer insulating pattern 156.

The third cell stacks CS3 may be disposed at intersection points of the second common conductive lines CCL2 and the second conductive lines CL2, respectively. A fifth filling insulation pattern 194 may fill a space between the third cell stacks CS3. A fifth capping pattern 192 may be disposed between the fifth filling insulation pattern 194 and sidewalls of the third cell stacks CS3 and between the fifth filling insulation pattern 194 and a second buffer insulating pattern 186. For example, the fifth capping pattern 192 may be in direct contact with a bottom portion of the fifth filling insulation pattern 194 and the second buffer insulating pattern 186.

Each of the first, second and third cell stacks CS1, CS2 and CS3 may include the first electrode BE, the switching pattern SP, the second electrode ME, the variable resistance pattern RP and the third electrode TE which are sequentially stacked, as described above.

In the present embodiment, the first and second common conductive lines CCL1 and CCL2 may be thicker than the first conductive lines CL1, For example, thicknesses of the first and second common conductive lines CCL1 and CCL2 may be at least twice the thickness of the first conductive lines CL1. In addition, the first and second common conductive lines CCL1 and CCL2 may be thicker than the second conductive lines CL2.

A first etch stop pattern ES1 may be disposed between each of the first common conductive lines CCL1 and the top surfaces of the first cell stacks CS1. The first etch stop pattern ES1 may be formed of a different metal material from that of the first common conductive lines CCL1. The second capping pattern 152 may conformally cover a sidewall of the first common conductive line CCL1 and a sidewall of the first etch stop pattern ES1. For example, the second capping pattern 152 may penetrate the first etch stop pattern ES1. The bottom surface of the second capping pattern 152 may be located at a lower level than a bottom surface of the first etch stop pattern ESL.

A second etch stop pattern ES2 may be disposed between each of the second common conductive lines CCL2 and the top surfaces of the second cell stacks CS2. The second etch stop pattern ES2 may be formed of a different metal material from that of the second common conductive lines CCL2. A fourth filling insulation pattern 184 may be disposed between the second common conductive lines CCL2. A fourth capping pattern 182 may conformally cover a sidewall of the second common conductive line CCL2 and a sidewall of the second etch stop pattern ES2. For example, the fourth capping pattern 182 may penetrate the second etch stop pattern ES2. A bottom surface of the fourth capping pattern 182 may be located at a lower level than a bottom surface of the second etch stop pattern ES2.

Each of the second conductive lines CL2 may be disposed on the third cell stacks CS3 arranged in the second direction D2. An upper etch stop pattern UES may be disposed between each of the second conductive lines CL2 and top surfaces of the third cell stacks CS3.

Figure 9:
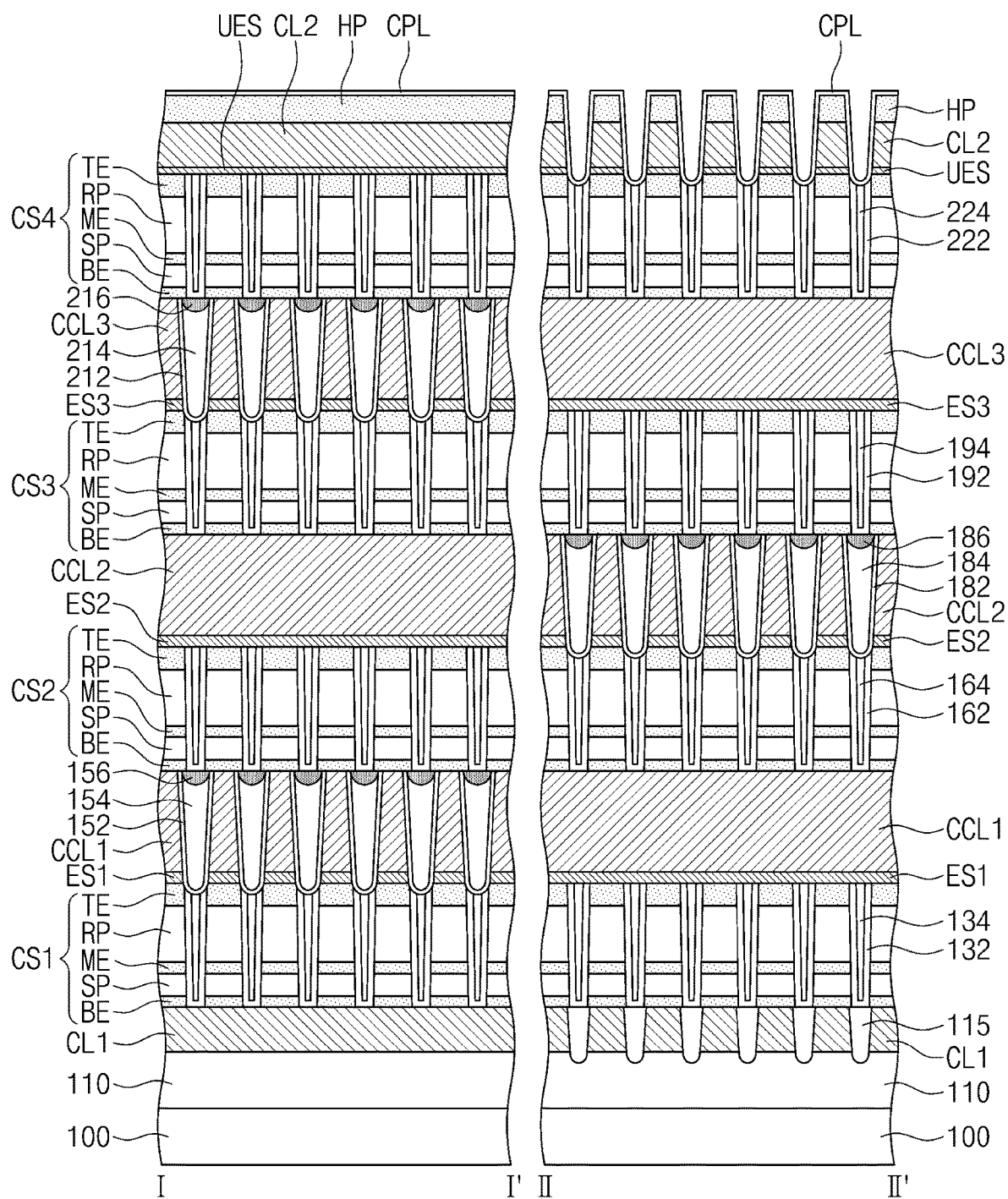

According to the exemplary embodiment of the inventive concept illustrated in FIG. 9, first to fourth cell stacks CS1, CS2, CS3 and CS4 may be vertically stacked between first conductive lines CL1 and second conductive lines CL2. Hereinafter, the descriptions to the same components as in the embodiment of FIG. 8 may be omitted or mentioned briefly for convenience in explanation.

The first cell stacks CS1 and the second cell stacks CS2 may share first common conductive lines CCL1, and the second cell stacks CS2 and the third cell stacks CS3 may share second common conductive lines CCL2. The third cell stacks CS3 and the fourth cell stacks CS4 may share third common conductive lines CCL3.

The first common conductive lines CCL1 may extend in the second direction D2 to intersect the first conductive lines CL1, and the second common conductive lines CCL2 may extend in the first direction D1 to intersect the first common conductive lines CCL1. The third common conductive lines CCL3 may extend in the second direction D2 to intersect the second common conductive lines CCL2. The second conductive lines CL2 may extend in the first direction D1 to intersect the third common conductive lines CCL3.

The third common conductive lines CCL3 may be disposed on the third cell stacks CS3, and a third etch stop pattern ES3 may be disposed between each of the third common conductive lines CCL3 and top surfaces of the third cell stacks CS3. The third common conductive lines CCL3 may have substantially the same features as the first and second common conductive lines CCL1 and CCL2 described above. The third etch stop pattern ES3 may have substantially the same features as the first and second etch stop patterns ES1 and ES2 described above.

A sixth filling insulation pattern 214 may be disposed between the third common conductive lines CCL3, and a sixth capping pattern 212 may conformally cover sidewalls of the third common conductive lines CCL3 and sidewalls of the third etch stop patterns ES3. A seventh filling insulation pattern 224 may be disposed between the fourth cell stacks CS4, and a seventh capping pattern 222 may be disposed between the seventh filling insulation pattern 224 and the fourth cell stacks CS4.

The second conductive lines CL2 may be disposed on the fourth cell stacks CS4, and an upper etch stop pattern UES may be disposed between each of the second conductive lines CL2 and top surfaces of the fourth cell stacks CS4.

Figure 10:
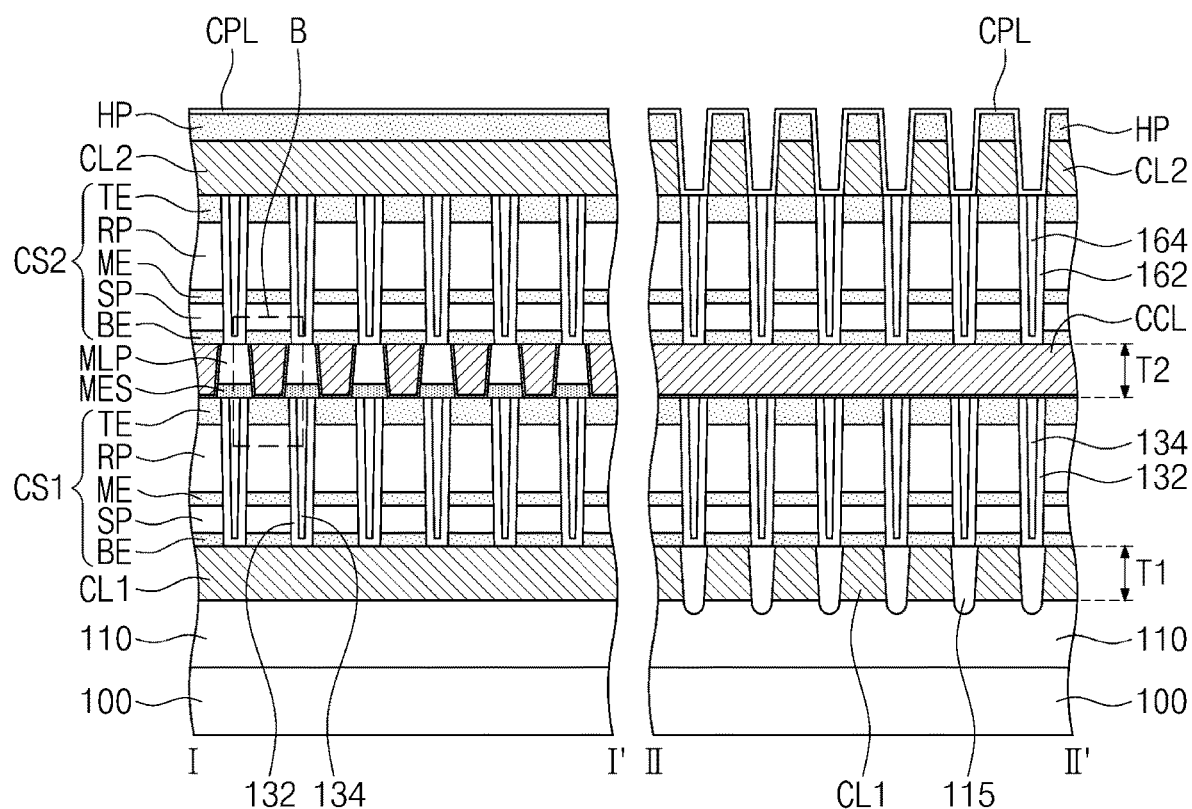
Figure 11:
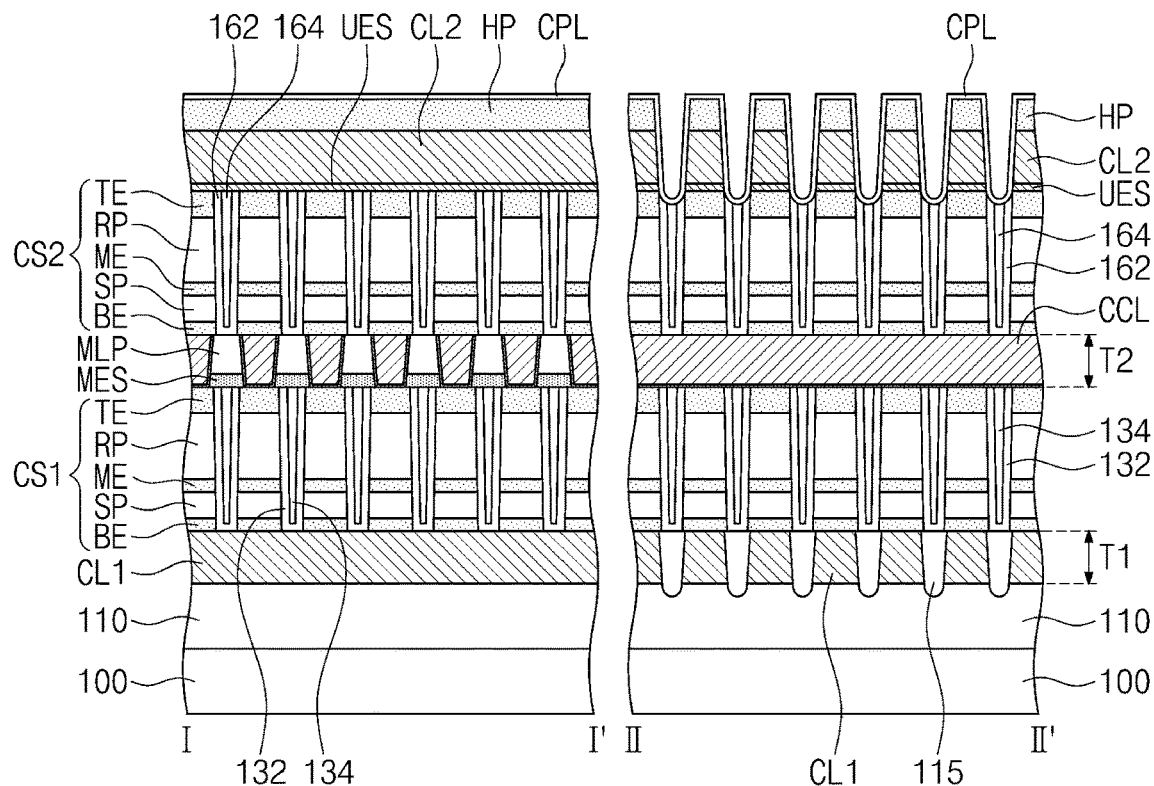
Figure 12:
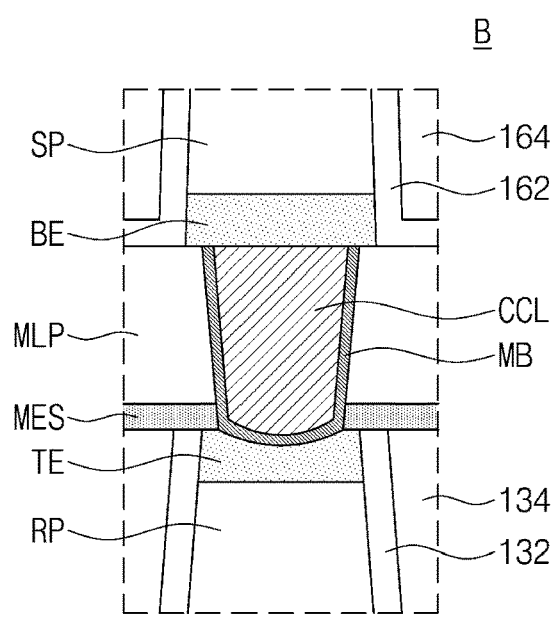
FIG. 12 is an enlarged view of a portion 'B' of FIG. 10.

According to exemplary embodiments of the inventive concept illustrated in FIGS. 10 and 11, common conductive lines CCL extending in the second direction D2 may be disposed between the first cell stacks CS1 and the second cell stacks CS2.

The first and second conductive lines CL1 and CL2 may include a first metal material, and the common conductive lines CCL may include a second metal material of which a resistivity is less than that of the first metal material. For example, the first and second conductive lines CL1 and CL2 may be formed of tungsten, aluminum, ruthenium, platinum, or any combination thereof. The first and second conductive lines CL1 and CL2 may further include a conductive metal nitride such as TiN, TaN, or WN. The common conductive lines CCL may include copper or a copper alloy. Here, the copper alloy may be an alloy obtained by mixing copper with a very small amount of C, Ag, Co, Ta, In, Sn, Zn, Mn, Ti, Mg, Cr, Ge, Sr, Pt, Al, or Zr.

The common conductive lines CCL may have a second thickness T2 which is substantially equal to or less than the first thickness T1 of the first conductive lines CL1. The second thickness T2 of the common conductive lines CCL may be substantially equal to or less than the thickness of the second conductive lines CL2.

A bottom width of each of the common conductive lines CCL may be less than a top width of each of the common conductive lines CCL. Referring to FIG. 12, the bottom width of each of the common conductive lines CCL may be less than a top width of the first cell stack CS1. For example, the bottom width of the common conductive line CCL in FIG. 12 may be less than that of the third electrode TE of the first cell stack CS1. A barrier metal pattern MB may conformally cover a bottom surface and sidewalls of each of the common conductive lines CCL. In other words, a bottom portion of the barrier metal pattern MB may be disposed between the third electrode TE of the first cell stack CS1 and the common conductive line CCL. A sidewall portion of the barrier metal pattern MB may be disposed between a mold pattern MLP and a sidewall of the common conductive line CCL and between a mold etch stop pattern MES and the sidewall of the common conductive line CCL. In exemplary embodiments of the inventive concept, the third electrode TE of the first cell stack CS1 may have a rounded top surface.

Referring again to FIG. 10, the mold pattern MLP may be disposed between the common conductive lines CCL, and the mold etch stop pattern MES may be disposed between the mold pattern MLP and the first filling insulation pattern 134. Here, the mold pattern MLP may include an insulating material, and the mold etch stop pattern MES may include a different insulating material from that of the mold pattern MLP. The mold pattern MLP may include a silicon oxide layer, or a low-k dielectric layer of which a dielectric constant is lower than that of silicon oxide. The mold etch stop pattern MES may include a silicon nitride layer, a silicon oxynitride layer, a silicon carbide layer, a silicon carbonitride layer, or any combination thereof.

The second conductive lines CL2 may be disposed on the second cell stacks CS2. Each of the second conductive lines CL2 may be in contact with the third electrodes TE of the second cell stacks CS2 arranged in the first direction D1.

According to the exemplary embodiment of the inventive concept illustrated in FIG. 11, the upper etch stop pattern UES may be disposed between each of the second conductive lines CL2 and the second cell stacks CS2. The upper etch stop pattern UES may be in contact with the third electrodes TE of the second cell stacks CS2 arranged in the first direction D1. In addition, the top surface of the third filling insulation pattern 164 may be recessed between the second conductive lines CL2. In other words, the bottom surface of the upper capping layer CPL may be located at a lower level than the bottom surface of the upper etch stop pattern UES.

FIGS. 13 to 24 are cross-sectional views taken along the lines I-I' and II-II' of FIG. 4 to illustrate a method for manufacturing a 3D semiconductor memory device according to exemplary embodiments of the inventive concept.

Figure 13:
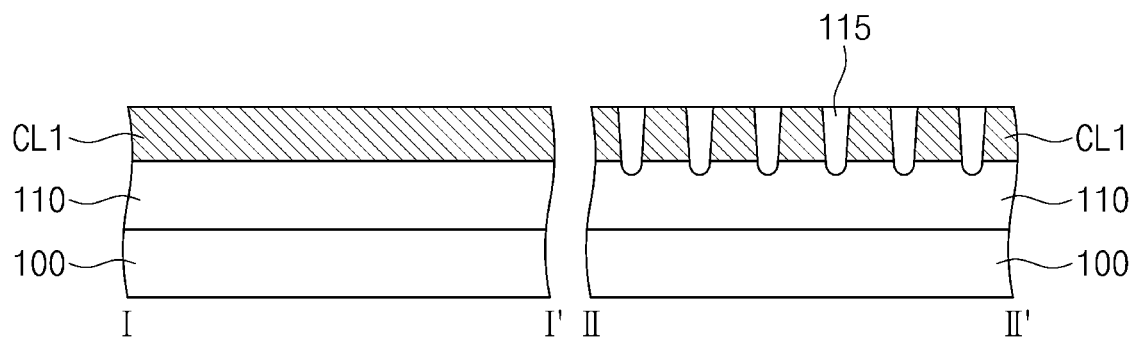
FIGS. 13, 14, 15, 16, 17, 18, 19, 20, 21, 22, 23 and 24 are cross-sectional views taken along the lines I-I' and II-II' of FIG. 4 to illustrate a method for manufacturing a 3D semiconductor memory device according to exemplary embodiments of the inventive concept.

Referring to FIGS. 4 and 13, first conductive lines CL1 may be formed on a substrate 100. The first conductive lines CL1 may extend in the first direction D1 and may be spaced apart from each other in the second direction D2.

In exemplary embodiments of the inventive concept, a first conductive layer may be deposited on the substrate 100, and then, the first conductive layer may be patterned to form the first conductive lines CL1. In exemplary embodiments of the inventive concept, the first conductive lines CL1 may be formed together with first cell stacks CS1 formed on the first conductive lines CL1.

The first conductive lines CL1 may include at least one of a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

An interlayer insulating layer 110 may be formed on the substrate 100 before the formation of the first conductive lines CL1, and a top surface of the interlayer insulating layer 110 between the first conductive lines CL1 may be recessed in the patterning process for forming the first conductive lines CL1. The interlayer insulating layer 110 may be formed of an oxide (e.g., silicon oxide) or a nitride (e.g., silicon nitride).

After the formation of the first conductive lines CL1, lower insulating patterns 115 may be formed to fill spaces between the first conductive lines CL1. The formation of the lower insulating patterns 115 may include depositing a lower insulating layer filling the spaces between the first conductive lines CL1, and planarizing the lower insulating layer to expose top surfaces of the first conductive lines CL1. For example, the lower insulating patterns 115 may include at least one of silicon oxide, silicon nitride, or silicon oxynitride.

Figure 14:
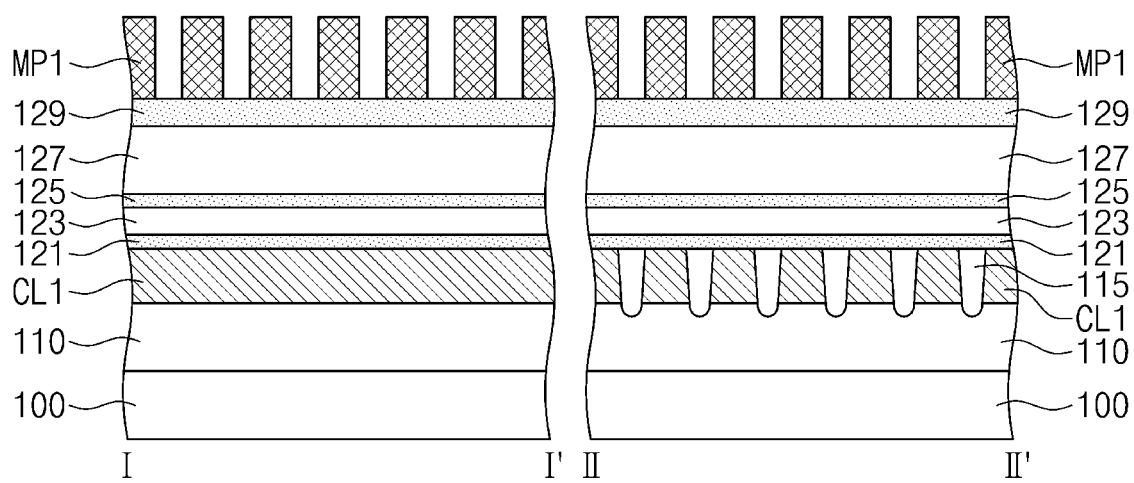

Referring to FIG. 14, a first electrode layer 121, a switching layer 123, a second electrode layer 125, a variable resistance layer 127 and a third electrode layer 129 may be sequentially stacked on the first conductive lines CL1 and the lower insulating patterns 115. In addition, metal layers may be formed between the second electrode layer 125 and the variable resistance layer 127 and between the third electrode layer 129 and the variable resistance layer 127, respectively. The third electrode layer 129 may be thicker than the first and second electrode layers 121 and 125. Alternatively, thicknesses of the first, second and third electrode layers 121, 125 and 129 may be substantially equal to each other.

The first, second and third electrode layers 121, 125 and 129 may be formed using a chemical vapor deposition (CVD) method, a metal organic CVD (MOCVD) method, or a plasma-enhanced CVD (PECVD) method.

First mask patterns MP1 may be formed on the third electrode layer 129. The first mask patterns MP1 may be spaced apart from each other in the first direction D1 and the second direction D2 on the third electrode layer 129. The first mask patterns MP1 may include silicon nitride, silicon carbide, and/or silicon oxynitride.

Figure 15:
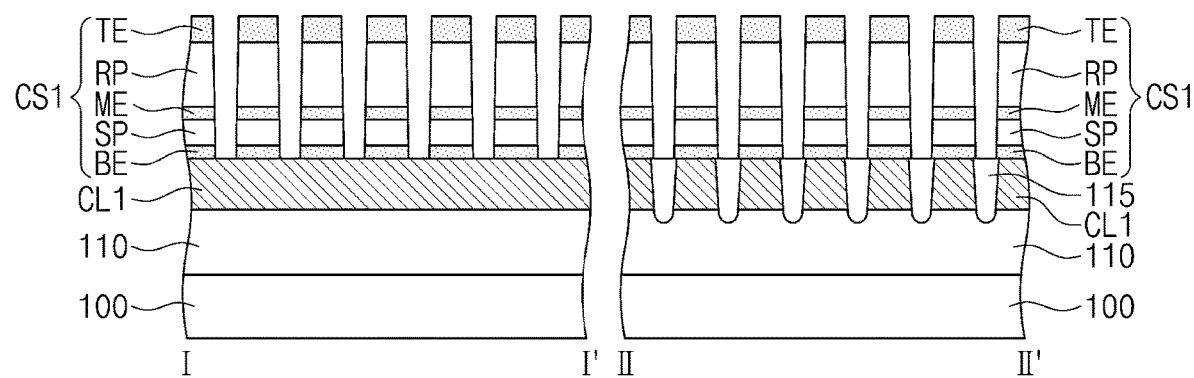

Referring to FIGS. 4 and 15, the third electrode layer 129, the variable resistance layer 127, the second electrode layer 125, the switching layer 123 and the first electrode layer 121 may be sequentially etched using the first mask patterns MP1 as etch masks. Thus, first cell stacks CS1 spaced apart from each other may be formed on each of the first conductive lines CL1. Each of the first cell stacks CS1 may include a first electrode BE, a switching pattern SP, a second electrode ME, a variable resistance pattern RP and a third electrode TE, which are sequentially stacked on each of the first conductive lines CL1. Each of the first cell stacks CS1 may be separated by the lower insulating patterns 115.

The formation of the first, second and third electrodes BE, ME and TE, the variable resistance patterns RP and the switching patterns SP may be performed using an anisotropic etching process having strong straightness. For example, the anisotropic etching process may include an ion beam etching process and/or a reactive ion etching process. When the first cell stacks CS1 are formed, a spacer layer covering a sidewall of the variable resistance pattern RP may be formed after the formation of the variable resistance pattern RP and before the formation of the switching pattern SP.

When the first cell stacks CS1 are formed, a width of the variable resistance pattern RP may be different from a width of the switching pattern SP. For example, the width of the variable resistance pattern RP may be less than the width of the switching pattern SP. The variable resistance pattern RP may have an inclined sidewall or a rounded sidewall. A top width of the switching pattern SP may be less than a bottom width of the switching pattern SP, and the switching pattern SP may have an inclined sidewall. In other words, the switching pattern SP may be tapered.

Figure 16:
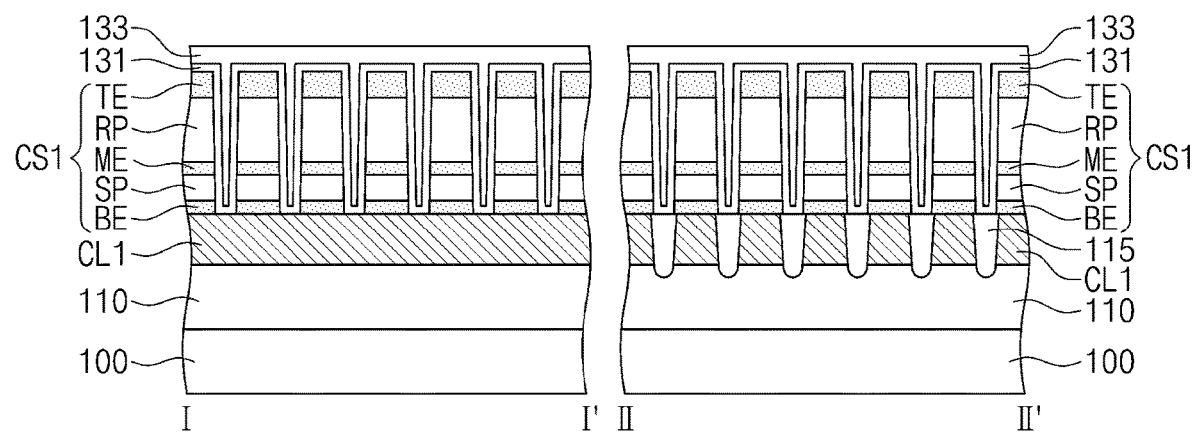

Referring to FIG. 16, a first capping layer 131 may be formed to cover the first cell stacks CS1. The first capping layer 131 may cover sidewalls of the first cell stacks CS1 and may cover top surfaces of the lower insulating patterns 115 exposed between the first cell stacks CS1. The first capping layer 131 may include silicon nitride and/or silicon oxynitride. The first capping layer 131 may be formed by an atomic layer deposition (ALD) method and/or a CVD method. A thickness of the first capping layer 131 may be less than a half of a distance between the first cell stacks CS1 adjacent to each other. Thus, an empty space may be formed between the first cell stacks CS1 after depositing the first capping layer 131.

Subsequently, a first filling insulation layer 133 may be formed to fill the empty space between the first cell stacks CS1. The first filling insulation layer 133 may be formed of a different insulating material from that of the first capping layer 131.

The first filling insulation layer 133 may completely fill the empty space between the first cell stacks CS1 on the first capping layer 131. The first filling insulation layer 133 may be formed using a layer-forming method having an excellent gap-fill property, for example, a flowable chemical vapor deposition (FCVD) method or a spin-on-coating method. The first filling insulation layer 133 may be formed of a low-k dielectric layer. For example, the first filling insulation layer 133 may include at least one of a SiC layer, a SiCN layer, a SiOCH layer, a SiOC layer, or a SiOF layer.

Figure 17:
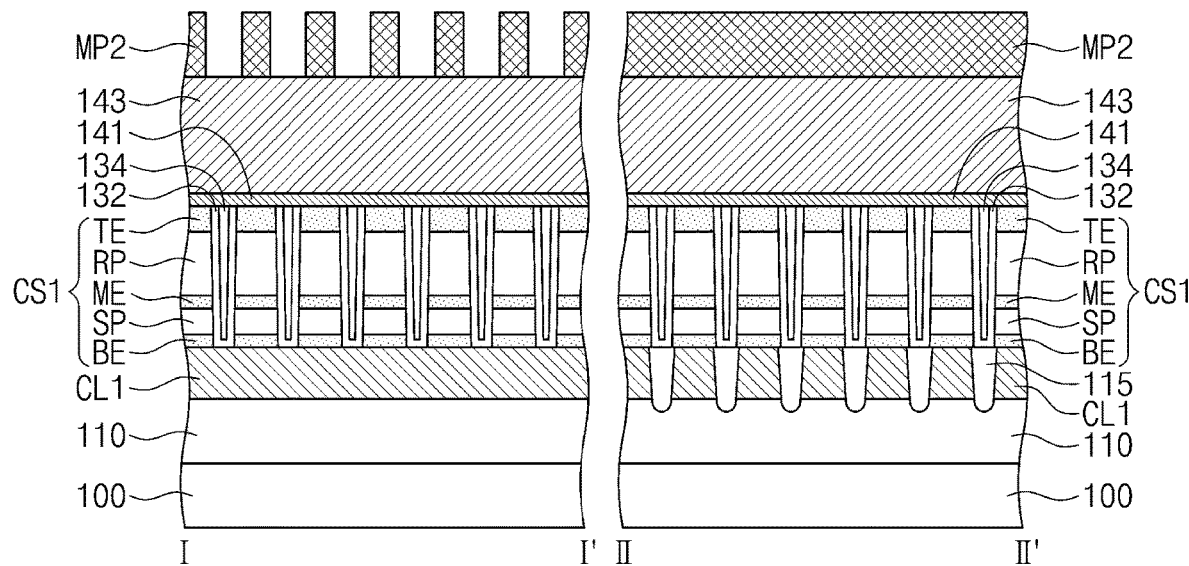

Referring to FIG. 17, a planarization process may be performed on the first filling insulation layer 133 and the first capping layer 131 to expose the third electrodes TE of the first cell stacks CS1. Thus, a first capping pattern 132 and a first filling insulation pattern 134 may be formed between the first cell stacks CS1. A chemical mechanical polishing (CMP) process may be performed as the planarization process. Top surfaces of the first capping pattern 132 and the first filling insulation pattern 134 may be recessed from top surfaces of the first cell stacks CS1 in the planarization process for forming the first capping pattern 132 and the first filling insulation pattern 134.

Next, an etch stop layer 141 and a common conductive layer 143 may be sequentially stacked on the first cell stacks CS1. The etch stop layer 141 may cover the top surfaces of the first cell stacks CS1 and the top surface of the first filling insulation pattern 134. The etch stop layer 141 and the common conductive layer 143 may be formed by an ALD method and/or a CVD method.

The etch stop layer 141 may be formed of a material having an etch selectivity with respect to the third electrodes TE of the first cell stacks CS1. The etch stop layer 141 may be formed of a conductive material and may include a metal material. For example, the etch stop layer 141 may be formed of Ti, Ta, TiN, TaN, AlN, or any combination thereof. The etch stop layer 141 may have a thickness of about 100 Å to about 200 Å.

The common conductive layer 143 may be formed of the same conductive material as the first conductive lines CL1. A thickness of the common conductive layer 143 may be equal to or greater than about twice a thickness of the first conductive lines CL1. The common conductive layer 143 may be formed of copper, tungsten, aluminum, ruthenium, platinum, or any combination thereof. The common conductive layer 143 may have a thickness of about 800 Å to about 1000 Å.

Next, second mask patterns MP2 may be formed on the common conductive layer 143. The second mask patterns MP2 may have line shapes extending in the second direction D2 on the common conductive layer 143. The second mask patterns MP2 may include silicon nitride, silicon carbide, and/or silicon oxynitride.

Figure 18:
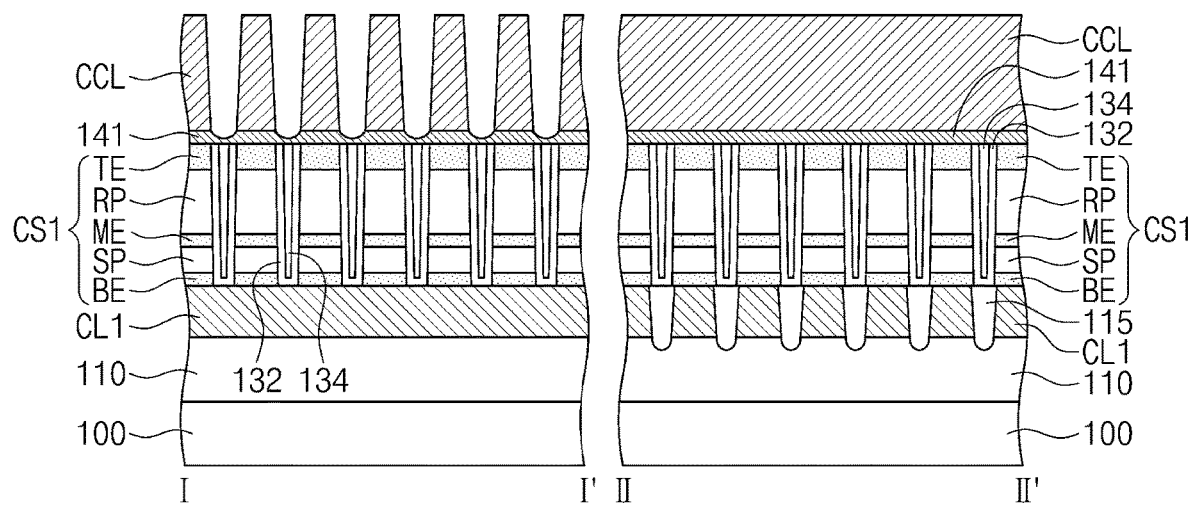

Referring to FIGS. 4 and 18, an anisotropic etching process may be performed on the common conductive layer 143 by using the second mask patterns MP2 as etch masks. Thus, common conductive lines CCL extending in the second direction D2 may be formed on the first cell stacks CS1. In the anisotropic etching process of the common conductive layer 143, the common conductive layer 143 may be etched until the etch stop layer 141 is exposed. For example, the common conductive layer 143 may be etched to form a concave shape in an upper portion of the etch stop layer 141.

The etch stop layer 141 may prevent the first cell stacks CS1 from being exposed during the formation of the common conductive lines CCL. Thus, it is possible to prevent the first cell stacks CS1 from being damaged during the formation of the thick common conductive lines CCL. Portions of the etch stop layer 141 may be etched when the common conductive layer 143 is etched, and thus a top surface of the etch stop layer 141 may be recessed, as noted above. A top width of each of the common conductive lines CCL may be less than a bottom width of each of the common conductive lines CCL, and each of the common conductive lines CCL may have an inclined sidewall. For example, some of the common conductive lines CCL may be tapered.

The second mask patterns MP2 may be removed during the formation of the common conductive lines CCL. Alternatively, a process for removing the second mask patterns MP2 may be performed after the formation of the common conductive lines CCL.

Figure 19:
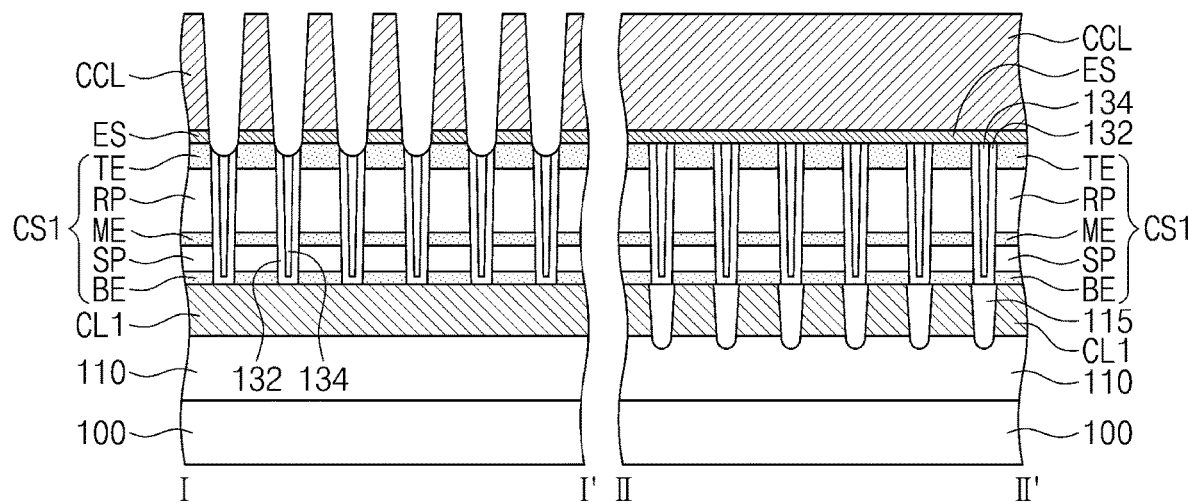

Referring to FIGS. 4 and 19, an etching process may be performed on the etch stop layer 141 to expose the first filling insulation pattern 134. Thus, etch stop patterns ES extending in the second direction D2 may be formed on the first cell stacks CS1.

The etching process of the common conductive layer 143 and the etching process of the etch stop layer 141 are individually illustrated in the drawings. Alternatively, an anisotropic etching process on the common conductive layer 143 and the etch stop layer 141 may be performed in-situ.

The top surface of the first filling insulation pattern 134 and/or the top surface of the first capping pattern 132 may be recessed by over-etching in the etching process for forming the etch stop patterns ES. The first filling insulation pattern 134 and the first capping pattern 132 may have a rounded top surface after the formation of the common conductive lines CCL and the etch stop patterns ES. In exemplary embodiments of the inventive concept, a portion of the first capping pattern 132 may be exposed when the etch stop patterns ES are formed. In addition, a portion of the first filling insulation pattern 134 may be exposed when the etch stop patterns ES are formed. In exemplary embodiments of the inventive concept, portions of sidewalls of the third electrodes TE of the first cell stacks CS1 may be exposed when the etch stop patterns ES are formed.

Figure 20:
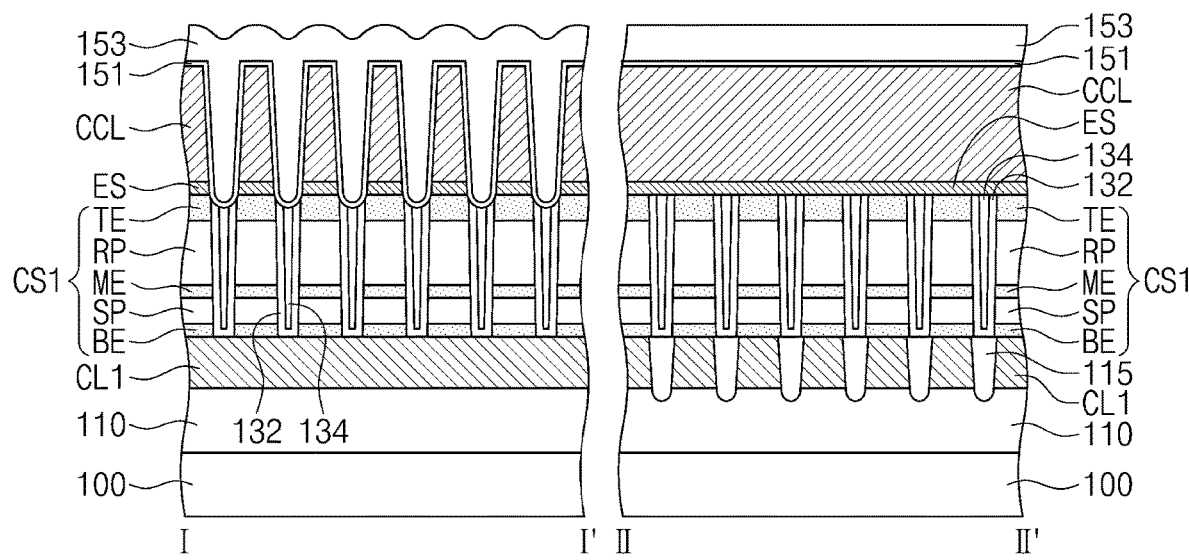

Referring to FIG. 20, a second capping layer 151 may be formed to conformally cover the common conductive lines CCL and sidewalls of the etch stop patterns ES. The second capping layer 151 may cover the top surface of the first capping pattern 132 and the top surface of the first filling insulation pattern 134, which are exposed between the common conductive lines CCL. The second capping layer 151 may be formed by an ALD method and/or a CVD method. The second capping layer 151 may include silicon nitride and/or silicon oxynitride.

A thickness of the second capping layer 151 may be less than a half of a distance between the common conductive lines CCL adjacent to each other. Thus, an empty space may be formed between the common conductive lines CCL after depositing the second capping layer 151.

Subsequently, a second filling insulation layer 153 may be formed on the second capping layer 151 to fill the empty space between the common conductive lines CCL. The second filling insulation layer 153 may be formed of a different insulating material from that of the second capping layer 151.

The second filling insulation layer 153 may be formed using a layer-forming method having an excellent gap-fill property, for example, a flowable chemical vapor deposition (FCVD) method or a spin-on-coating method.

The second filling insulation layer 153 may be formed of an oxide-based material doped with impurities. For example, the oxide-based material doped with impurities may include a fluorine-doped oxide (or fluorosilicate glass (FSG)), a carbon-doped oxide (e.g., SiOC), silicon oxide, hydrogen silsesquioxane (SiO:H; HSQ), methyl silsesquioxane (SiO:CH$_3$; MSQ), or a-SiOC (SiOC:H).

Figure 21:
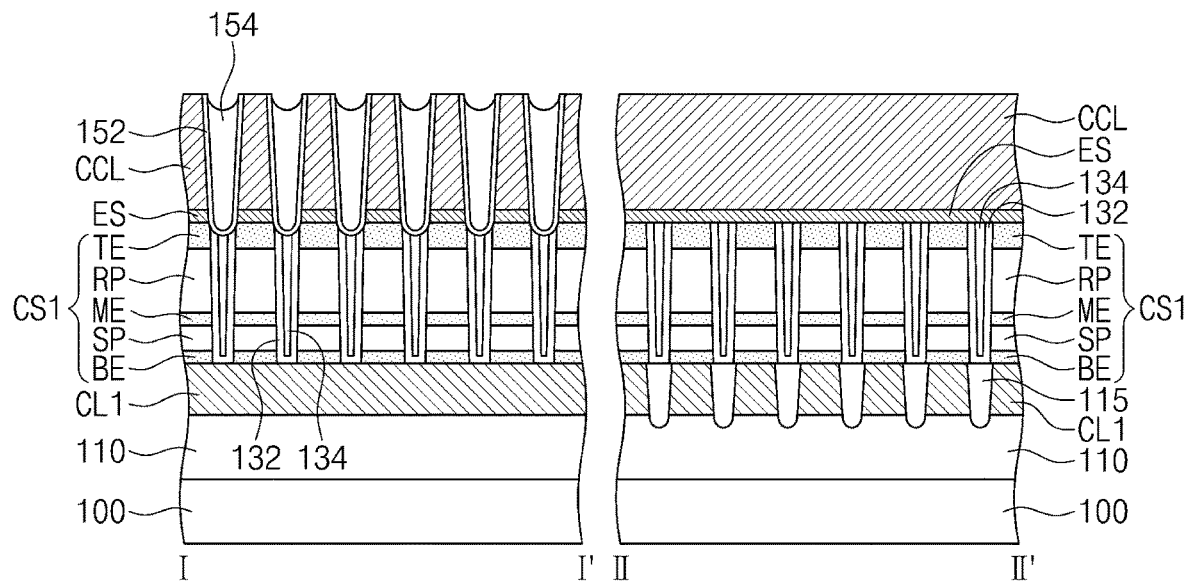

Referring to FIG. 21, a planarization process may be performed on the second filling insulation layer 153 and the second capping layer 151 to expose top surfaces of the common conductive lines CCL. Thus, a second capping pattern 152 and a second filling insulation pattern 154 may be formed between the common conductive lines CCL. A chemical mechanical polishing (CMP) process may be performed as the planarization process. Top surfaces of the second filling insulation patterns 154 may be recessed between the common conductive lines CCL in the planarization process. Thus, the top surfaces of the second filling insulation patterns 154 may be lower than the top surfaces of the common conductive lines CCL. The second filling insulation patterns 154 may have rounded top surfaces. In other words, recess regions may be formed between the common conductive lines CCL.

Figure 22:
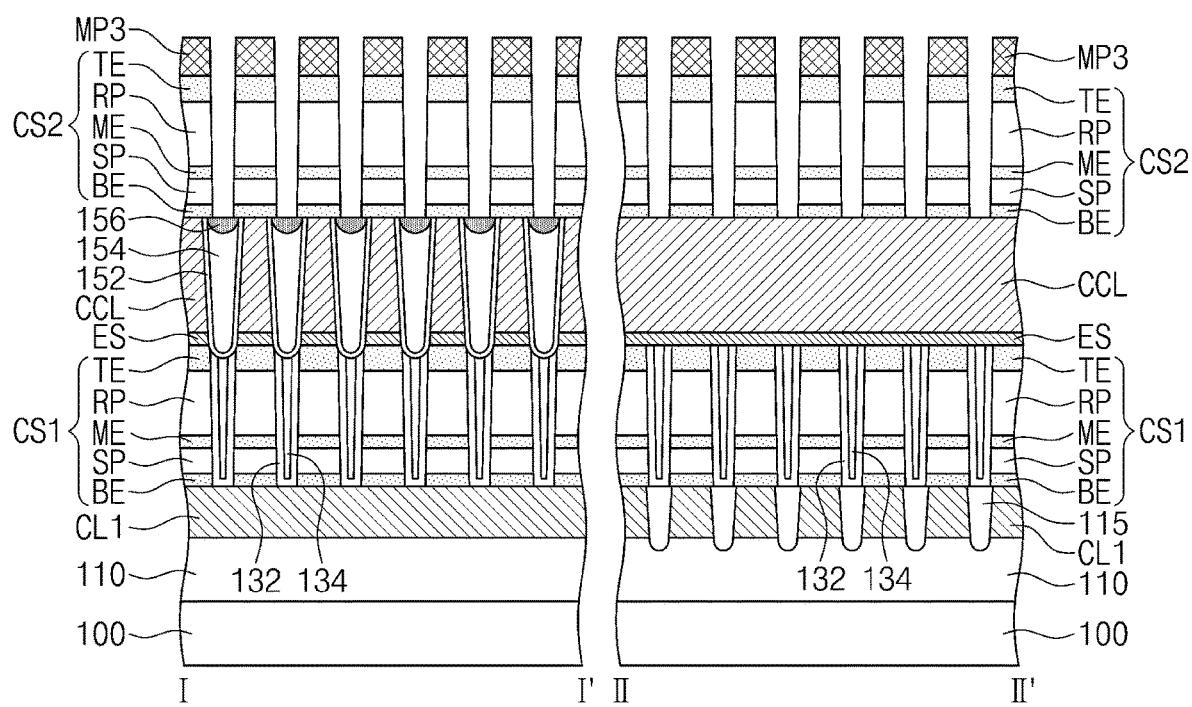

Referring to FIG. 22, buffer insulating patterns 156 may be formed to fill the recess regions of the second filling insulation patterns 154. The formation of the buffer insulating patterns 156 may include forming a buffer insulating layer filling the recess regions of the second filling insulation patterns 154 and covering the common conductive lines CCL, and planarizing the buffer insulating layer to expose the top surfaces of the common conductive lines CCL. The buffer insulating patterns 156 may be formed of a different insulating material from those of the second capping patterns 152 and the second filling insulation patterns 154.

Next, referring to FIGS. 4 and 22, second cell stacks CS2 may be formed on each of the common conductive lines CCL. The second cell stacks CS2 may be spaced apart from each other in the first direction D1 and the second direction D2, like the first cell stacks CS1. A method of forming the second cell stacks CS2 may be substantially similar to the method of forming the first cell stacks CS1. The formation of the second cell stacks CS2 may include sequentially stacking a first electrode layer, a switching layer, a second electrode layer, a variable resistance layer, and a third electrode layer on the common conductive lines CCL, forming third mask patterns MP3 on the third electrode layer, and anisotropically etching the third electrode layer, the variable resistance layer, the second electrode layer, the switching layer, and the first electrode layer by using the third mask patterns MP3 as etch masks. Thus, each of the second cell stacks CS2 may include a first electrode BE, a switching pattern SP, a second electrode ME, a variable resistance pattern RP and a third electrode TE, which are sequentially stacked on each of the common conductive lines CCL.

The second cell stacks CS2 may be formed using an anisotropic etching process having strong straightness, and the buffer insulating patterns 156 between the common conductive lines CCL may be used as an etch stop layer in the anisotropic etching process.

Figure 23:
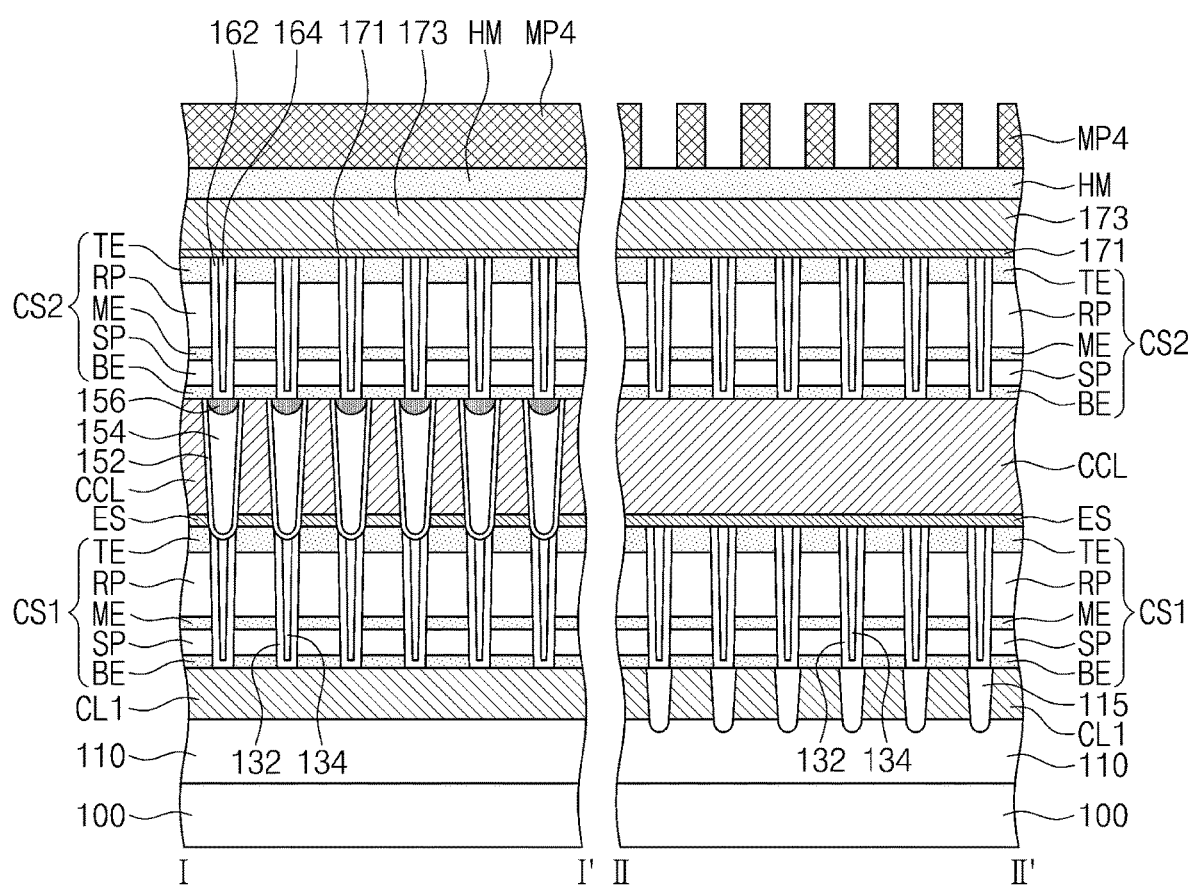

Referring to FIG. 23, a third capping pattern 162 and a third filling insulation pattern 164 may be formed between the second cell stacks CS2, like the formation of the first capping pattern 132 and the first filling insulation pattern 134. The third capping pattern 162 and the third filling insulation pattern 164 may be formed of different insulating materials from each other. The third capping pattern 162 may be in contact with the buffer insulating patterns 156 or the second filling insulation patterns 154.

The formation of the third capping pattern 162 and the third filling insulation pattern 164 may include sequentially depositing a third capping layer and a third filling insulation layer which cover the second cell stacks CS2, and performing a planarization process on the third filling insulation layer and the third capping layer to expose the third electrodes TE of the second cell stacks CS2. Top surfaces of the third capping pattern 162 and the third filling insulation pattern 164 may be recessed from top surfaces of the second cell stacks CS2 in the planarization process for forming the third capping pattern 162 and the third filling insulation pattern 164.

Subsequently, referring to FIGS. 4 and 23, an upper etch stop layer 171, an upper conductive layer 173 and a hard mask layer HM may be sequentially stacked on the second cell stacks CS2. The upper etch stop layer 171 may cover the third electrodes TE of the second cell stacks CS2, the third capping pattern 162, and the third filling insulation pattern 164.

The upper etch stop layer 171 may be formed of a material having an etch selectivity with respect to the third electrodes TE of the second cell stacks CS2. For example, the upper etch stop layer 171 may directly contact the third electrodes TE and upper portions of the third capping pattern 162 and the third filling insulation pattern 164. The upper etch stop layer 171 may be formed of a conductive material and may include a metal material. The upper etch stop layer 171 may be thinner than the etch stop patterns ES.

The upper conductive layer 173 may be thinner than the common conductive lines CCL and may have substantially the same thickness as the first conductive lines CL1. The upper conductive layer 173 may be formed of the same conductive material as the first conductive lines CL1. The hard mask layer HM may be formed of an insulating material having an etch selectivity with respect to the upper conductive layer 173.

Next, fourth mask patterns MP4 may be formed on the hard mask layer HM. The fourth mask patterns MP4 may have line shapes extending in the first direction D1 on the hard mask layer HM. In other words, spaces may be formed between the fourth mask patterns MP4. The fourth mask patterns MP4 may include silicon nitride, silicon carbide, and/or silicon oxynitride.

Figure 24:
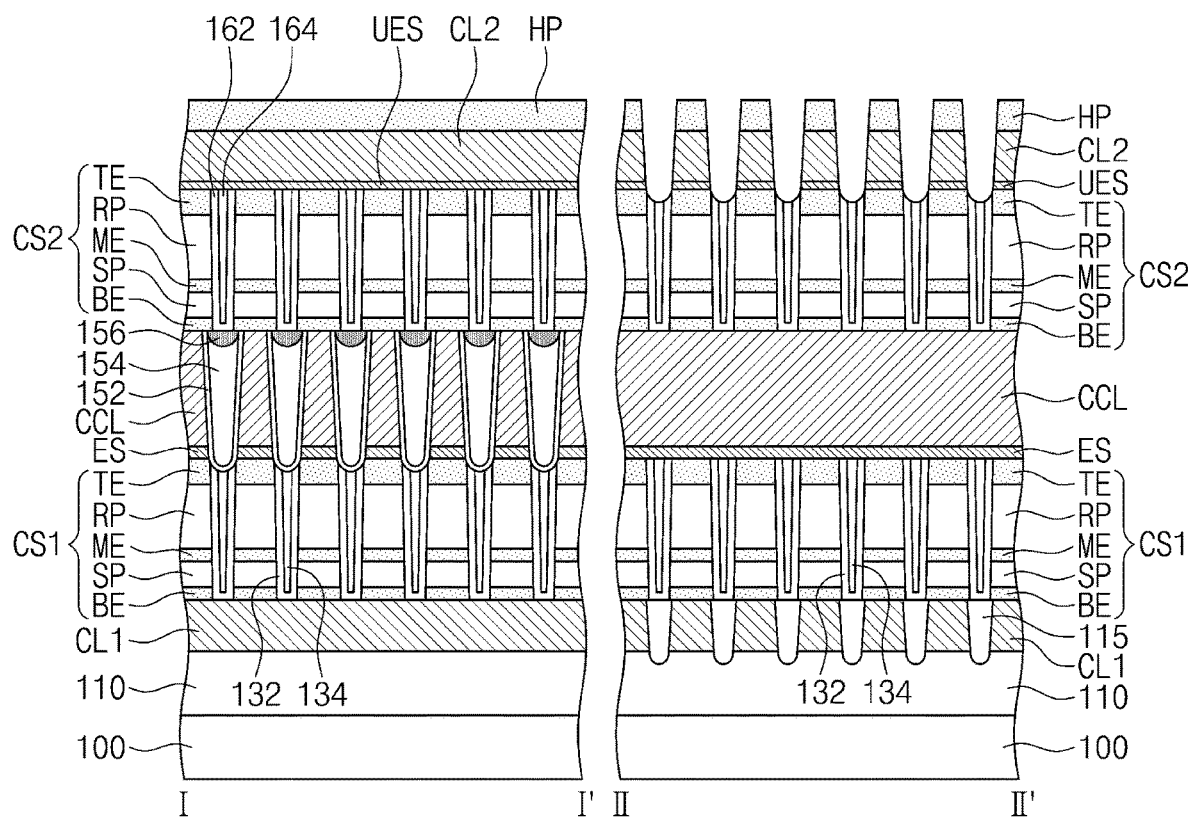

Referring to FIGS. 4 and 24, an anisotropic etching process may be performed on the hard mask layer HM and the upper conductive layer 173 by using the fourth mask patterns MP4 as etch masks. In the anisotropic etching process of the upper conductive layer 173, the upper etch stop layer 171 may be used as an etch stop layer and may be etched by over-etching. Thus, hard mask patterns HP, second conductive lines CL2 and upper etch stop patterns UES, which extend in the first direction D1, may be formed on the second cell stacks CS2. The fourth mask patterns MP4 may be removed after the formation of the second conductive lines CL2 and the upper etch stop patterns UES.

Top surfaces of the third capping pattern 162 and the third filling insulation pattern 164 may be recessed between the second conductive lines CL2 when the second conductive lines CL2 and the upper etch stop patterns UES are formed. The recess regions of the third capping pattern 162 and the third filling insulation pattern 164 are located in areas between the fourth mask patterns MP4.

Next, referring to FIGS. 5A and 5B, an upper capping layer CPL may be formed to conformally cover sidewalls of the second conductive lines CL2. The upper capping layer CPL may cover top surfaces and sidewalls of the hard mask patterns HP and may cover the third capping pattern 162 and the third filling insulation pattern 164 which are exposed between the second conductive lines CL2. The upper capping layer CPL may include silicon nitride and/or silicon oxynitride. The upper capping layer CPL may be formed by an ALD method and/or a CVD method.

FIGS. 25 to 29 are cross-sectional views taken along the lines I-I' and II-II' of FIG. 4 to illustrate a method for manufacturing a 3D semiconductor memory device according to exemplary embodiments of the inventive concept. Hereinafter, the descriptions to the same features as mentioned with reference to FIGS. 4 to 24 may be omitted for convenience in explanation.

Figure 25:
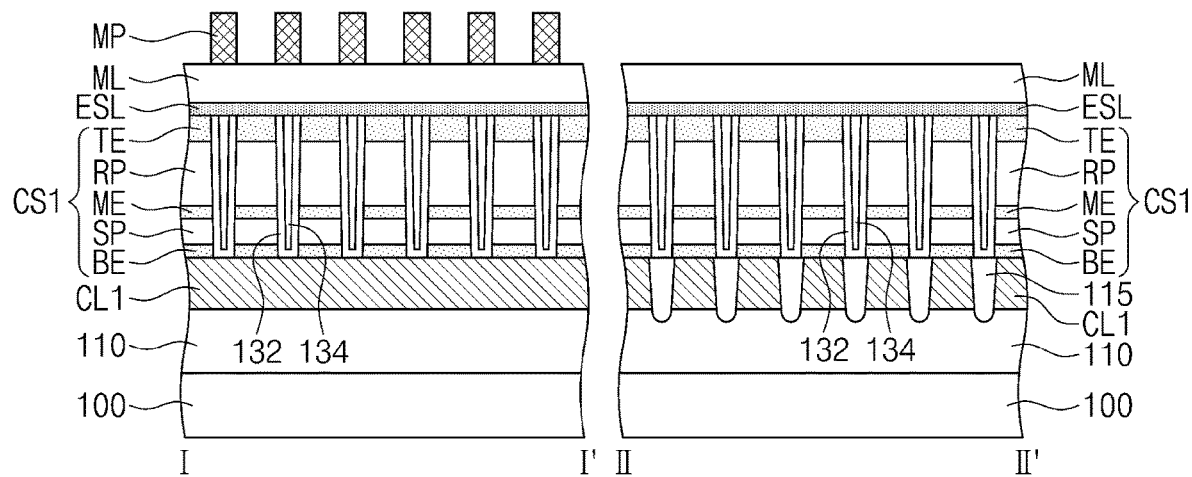
FIGS. 25, 26, 27, 28 and 29 are cross-sectional views taken along the lines I-I' and II-II' of FIG. 4 to illustrate a method for manufacturing a 3D semiconductor memory device according to exemplary embodiments of the inventive concepts.

Referring to FIG. 25, the first conductive lines CL1, the first cell stacks CS1, the first capping pattern 132 and the first filling insulation pattern 134 may be formed as described above with reference to FIGS. 13 to 16.

A mold etch stop layer ESL and a mold layer ML may be formed on the first cell stacks CS1 after the formation of the first capping pattern 132 and the first filling insulation pattern 134. Here, the mold etch stop layer ESL may be formed of an insulating material having an etch selectivity with respect to the mold layer ML. For example, the mold etch stop layer ESL may be formed of a silicon nitride layer, a silicon oxynitride layer, a silicon carbide layer, a silicon carbonitride layer, or any combination thereof. The mold layer ML may be formed of silicon oxide, or a low-k dielectric material having a dielectric constant lower than that of silicon oxide.

After the formation of the mold layer ML, mold mask patterns MP having line shapes extending in the second direction D2 may be formed on the mold layer ML.

Figure 26:
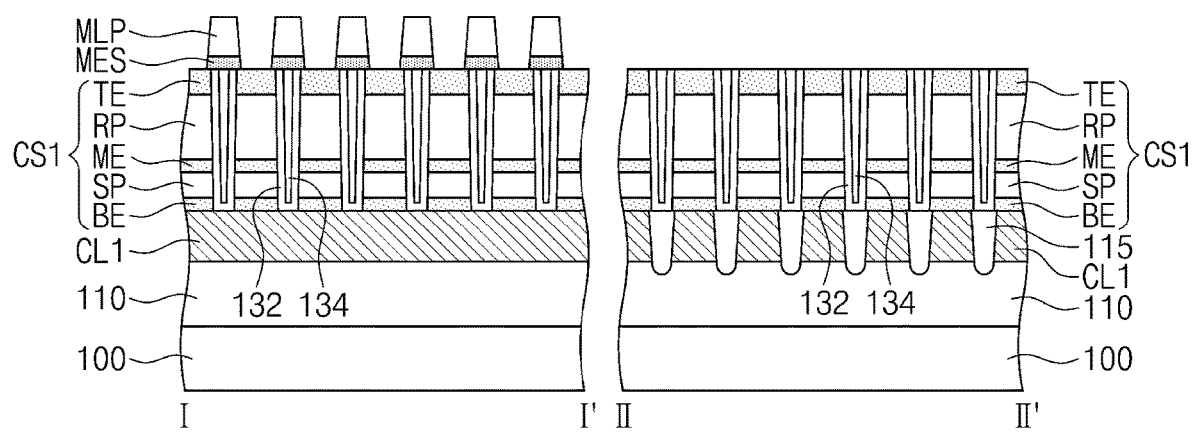

Referring to FIG. 26, the mold layer ML may be anisotropically etched using the mold mask patterns MP as etch masks, thereby forming mold patterns MLP. When the mold patterns MLP are formed, the mold etch stop layer ESL may be etched by over-etching to form mold etch stop patterns MES. In other words, trenches may be formed. For example, trenches may be formed between adjacent stacks of mold patterns MLP and mold etch stop patterns MES. Each of the trenches may expose the third electrodes TE of the first cell stacks CS1 arranged in the second direction D2. The top surfaces of the third electrodes TE of the first cell stacks CS1 exposed by the trenches may be partially recessed in the formation of the mold patterns MLP. The mold mask patterns MP may be removed after the formation of the trenches.

Figure 27:
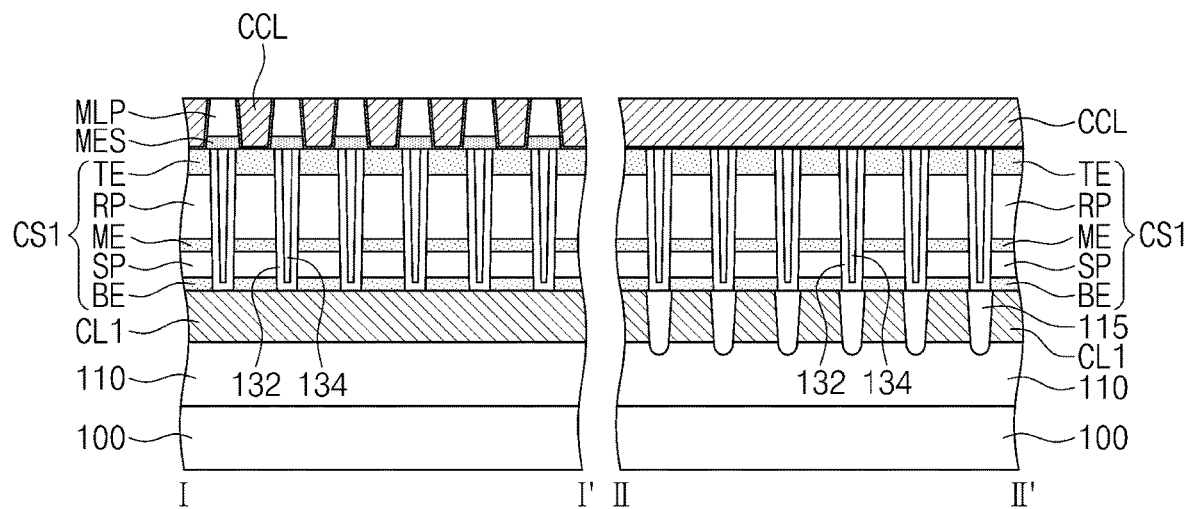

Referring to FIG. 27, common conductive lines CCL may be formed in the trenches. The formation of the common conductive lines CCL may include forming a barrier metal layer conformally covering inner surfaces of the trenches, forming a metal layer completely filling the trenches having the barrier metal layer, and planarizing the metal layer and the barrier metal layer to expose top surfaces of the mold patterns MLP. Thus, each of the common conductive lines CCL may include a barrier metal pattern and a metal pattern.

Here, the common conductive lines CCL may include a different metal material from that of the first conductive lines CL1. A resistivity of the metal material in the common conductive lines CCL may be less than that of the metal material in the first conductive lines CL1. For example, the common conductive lines CCL may include copper or a copper alloy. Here, the copper alloy may be an alloy obtained by mixing copper with a very small amount of C, Ag, Co, Ta, In, Sn, Zn, Mn, Ti, Mg, Cr, Ge, Sr, Pt, Al, or Zr. The barrier metal layer may include a conductive metal nitride such as titanium nitride, tantalum nitride, and/or tungsten nitride.

Figure 28:
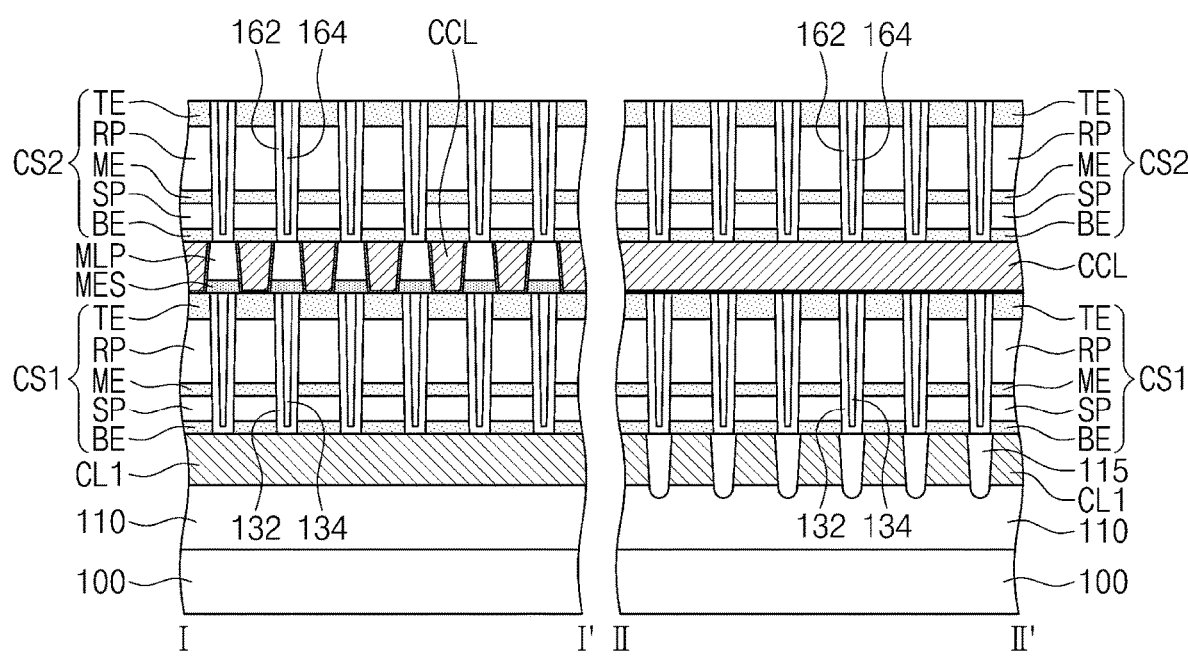

Referring to FIG. 28, the second cell stacks CS2 may be formed on the common conductive lines CCL, as described above with reference to FIG. 22. Next, the third capping pattern 162 and the third filling insulation pattern 164 may be formed between the second cell stacks CS2, as described above with reference to FIG. 23. Here, the third capping pattern 162 may be in contact with the mold patterns MLP.

Figure 29:
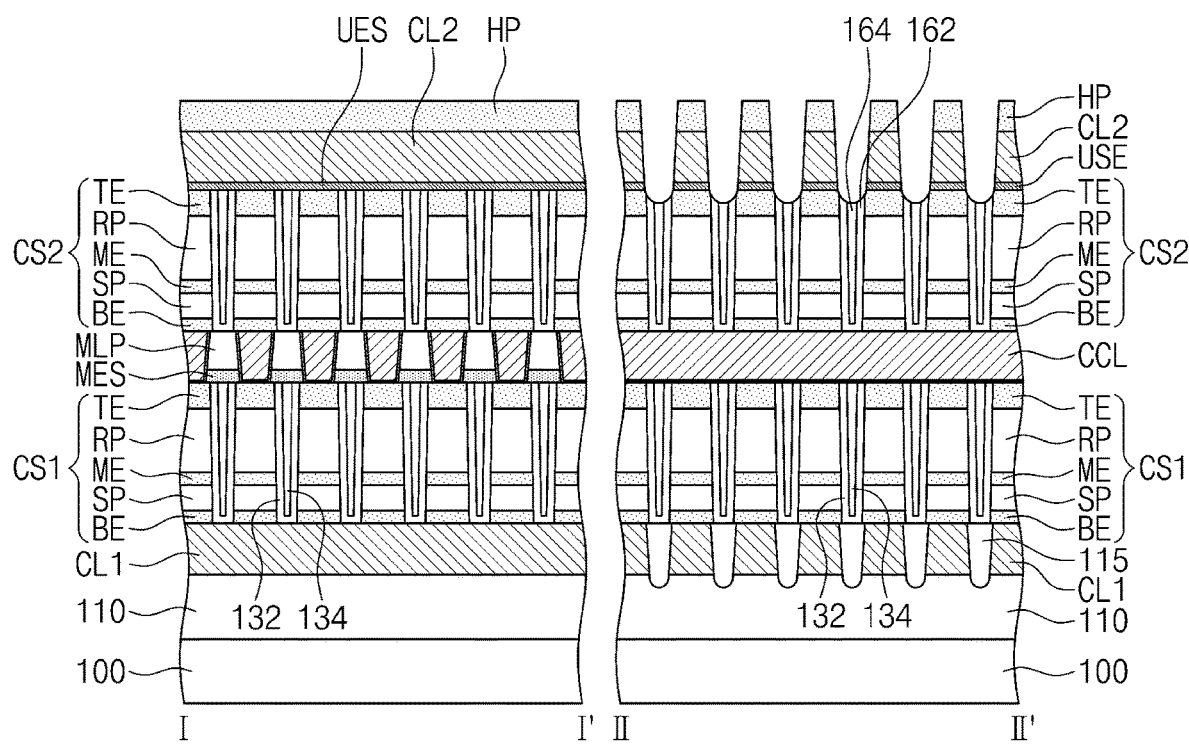

Referring to FIG. 29, the second conductive lines CL2 extending in the first direction D1 may be formed on the second cell stacks CS2, as described above with reference to FIGS. 23 and 24. In other words, the upper etch stop patterns UES may be formed between the second conductive lines CL2 and the second cell stacks CS2 when the second conductive lines CL2 are formed. Here, the upper etch stop patterns UES may be formed of a conductive material.

According to exemplary embodiments of the inventive concept, the resistance of the common conductive lines shared by the first and second memory cells may be reduced, and thus electrical characteristics of the 3D semiconductor memory device may be improved.

In addition, the etch stop pattern may be used in the formation of the common conductive lines, and thus it is possible to prevent the cell stacks under the common conductive lines from being damaged.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. A three-dimensional (3D) semiconductor memory device, comprising:
    first cell stacks arranged in a first direction and a second direction which are parallel to a top surface of a substrate and intersect each other,
    second cell stacks disposed on the first cell stacks and arranged in the first direction and the second direction;
    first conductive lines extending in the first direction and provided between the substrate and the first cell stacks;
    common conductive lines extending in the second direction and provided between the first cell stacks and the second cell stacks;
    etch stop patterns extending in the second direction and provided between the common conductive lines and top surfaces of the first cell stacks, the etch stop patterns including a conductive material;
    second conductive lines extending in the first direction and provided on the second cell stacks; and
    a capping pattern covering sidewalls of the common conductive lines and sidewalls of the etch stop patterns,
    wherein each of the common conductive lines has a second thickness greater than a first thickness of each of the first conductive lines.

2. The 3D semiconductor memory device of claim 1, wherein a bottom width of one of the etch stop patterns is greater than a top width of one of the first cell stacks.

3. The 3D semiconductor memory device of claim 1, wherein a top width of one of the common conductive lines is less than a bottom width of one of the second cell stacks.

4. The 3D semiconductor memory device of claim 1, wherein the second thickness is at least twice the first thickness.

5. The 3D semiconductor memory device of claim 1, further comprising:
    a filling insulation pattern disposed between the common conductive lines,
    wherein a bottom surface of the filling insulation pattern is located below a bottom surface of one of the etch stop patterns.

6. The 3D semiconductor memory device of claim 5, further comprising:
    a lower filling insulation pattern provided between the first cell stacks,
    wherein the capping pattern includes a bottom portion disposed between the filling insulation pattern and the lower filling insulation pattern.

7. The 3D semiconductor memory device of claim 6, wherein each of the first and second cell stacks comprises:
    first, second and third electrodes sequentially stacked;
    a switching pattern between the first and second electrodes; and
    a variable resistance pattern between the second and third electrodes,
    wherein the bottom portion of the capping pattern is located between a top surface and a bottom surface of the third electrode of each of the first cell stacks.

8. The 3D semiconductor memory device of claim 5, further comprising:
    an upper filling insulation pattern disposed between the second cell stacks; and
    an upper capping pattern disposed between the upper filling insulation pattern and sidewalls of the second cell stacks and between the upper filling insulation pattern and the filling insulation pattern,
    wherein a bottom surface of the upper capping pattern is located at substantially the same level as top surfaces of the common conductive lines.

9. The 3D semiconductor memory device of claim 8, further comprising:
    a buffer insulating pattern disposed on the filling insulation pattern between the common conductive lines,
    wherein the upper capping pattern is in contact with a top surface of the buffer insulating pattern.

10. The 3D semiconductor memory device of claim 1, further comprising:
    an upper etch stop pattern disposed between each of the second conductive lines and top surfaces of the second cell stacks and formed of a conductive material,
    wherein the second thickness of the common conductive lines is greater than a third thickness of the second conductive lines, and wherein the upper etch stop pattern is thinner than the etch stop pattern.

11. A three-dimensional (3D) semiconductor memory device, comprising:
a first conductive line extending in a first direction parallel to a top surface of a substrate;
first cell stacks on the first conductive line;
a first filling insulation pattern between the first cell stacks;
a common conductive line extending in a second direction intersecting the first direction on each of the first cell stacks;
an etch stop pattern disposed between the common conductive line and each of the first cell stacks and formed of a conductive material;
second cell stacks on the common conductive line;
a second filling insulation pattern covering a sidewall of the common conductive line and a sidewall of the etch stop pattern;
a capping pattern disposed between the sidewall of the common conductive line and the second filling insulation pattern and between the sidewall of the etch stop pattern and the second filling insulation pattern; and
a second conductive line extending in the first direction on each of the second cell stacks,
wherein the common conductive line has a second thickness greater than a first thickness of the first conductive line.

12. The 3D semiconductor memory device of claim 11, wherein a bottom surface of the second filling insulation pattern is located below a top surface of the first cell stack.

13. The 3D semiconductor memory device of claim 11, wherein each of at least one of the first and second cell stacks comprises:
first, second and third electrodes;
a switching pattern between the first electrode and the second electrode; and
a variable resistance pattern between the second electrode and the third electrode,
wherein the capping pattern includes a bottom portion between the first filling insulation pattern and the second filling insulation pattern, and the bottom portion of the capping pattern is located between a top surface and a bottom surface of the third electrode of the first cell stack.

14. The 3D semiconductor memory device of claim 11, wherein a bottom width of the etch stop pattern is greater than a top width of the first cell stack.

15. The 3D semiconductor memory device of claim 11, wherein a top width of the common conductive line is less than a bottom width of the second cell stack.

16. A three-dimensional (3D) semiconductor memory device, comprising:
a plurality of first conductive lines extending in a first direction on a substrate;
a stack structure comprising a plurality of cell array layers vertically stacked on the first conductive lines, wherein each of the cell array layers comprises cell stacks arranged in the first direction and a second direction intersecting the first direction;
a plurality of common conductive lines provided between the cell array layers, wherein a thickness of the common conductive lines is greater than a thickness of the first conductive lines;
an etch stop pattern disposed between a bottom surface of each of the common conductive lines and top surfaces of the cell stacks and formed of a conductive material; and
a plurality of second conductive lines extending in the first direction or the second direction on the stack structure.

17. The 3D semiconductor memory device of claim 16, wherein the thickness of one of the common conductive lines is greater than a thickness of one of the second conductive lines.

18. The 3D semiconductor memory device of claim 16, further comprising:
a filling insulation pattern disposed between the common conductive lines; and
a capping pattern disposed between the filling insulation pattern and sidewalls of the common conductive lines and between the filling insulation pattern and sidewalls of the etch stop pattern.

19. The 3D semiconductor memory device of claim 18, wherein a bottom surface of the filling insulation pattern is located below a bottom surface of the etch stop pattern.

20. The 3D semiconductor memory device of claim 18, wherein at least one of the cell stacks comprises:
first, second and third electrodes sequentially stacked;
a switching pattern between the first and second electrodes; and
a variable resistance pattern between the second and third electrodes,
wherein the etch stop pattern is in contact with top surfaces of the third electrodes of the cell stacks, and
wherein a bottom surface of the capping pattern is located between a top surface and a bottom surface of the third electrode.

* * * * *